(12) United States Patent
Tsukamoto et al.

(10) Patent No.: US 6,739,761 B2
(45) Date of Patent: May 25, 2004

(54) OPTICAL-ELECTRIC PRINTED WIRING BOARD, PRINTED CIRCUIT BOARD, AND METHOD OF FABRICATING OPTICAL-ELECTRIC PRINTED WIRING BOARD

(75) Inventors: Takehito Tsukamoto, Tokyo (JP); Takao Minato, Tokyo (JP); Kenta Yotsui, Tokyo (JP); Daisuke Inokuchi, Tokyo (JP); Masayuki Ode, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 0 days.

(21) Appl. No.: 09/992,892

(22) Filed: Nov. 27, 2001

(65) Prior Publication Data

US 2002/0061154 A1 May 23, 2002

Related U.S. Application Data

(63) Continuation of application No. PCT/JP00/03440, filed on May 29, 2000.

(30) Foreign Application Priority Data

May 28, 1999 (JP) .......................................... 11-150460
May 28, 1999 (JP) .......................................... 11-150461

(51) Int. Cl.[7] ................................................. G02B 6/42
(52) U.S. Cl. ........................................ 385/89; 385/90
(58) Field of Search ......................... 385/40–41, 88–91

(56) References Cited

U.S. PATENT DOCUMENTS

| | | | |
|---|---|---|---|
| 4,756,590 A | * 7/1988 | Forrest et al. | ........... 350/96.15 |
| 5,125,054 A | 6/1992 | Ackley et al. | |
| 5,337,219 A | 8/1994 | Carr et al. | |
| 5,345,524 A | 9/1994 | Lebby et al. | |
| 5,394,490 A | * 2/1995 | Kato et al. | ............ 385/14 |
| 5,416,861 A | 5/1995 | Koh et al. | |
| 5,499,732 A | 3/1996 | Nishimoto | |
| 5,835,646 A | 11/1998 | Yoshimura et al. | |
| 5,901,050 A | 5/1999 | Imai | |
| 6,144,507 A | * 11/2000 | Hashimoto | .................. 359/819 |
| 6,324,328 B1 | 11/2001 | Mehlhorn et al. | |
| 6,370,292 B1 | 4/2002 | Strake | |

FOREIGN PATENT DOCUMENTS

| | | |
|---|---|---|
| EP | 0129137 A2 | 12/1984 |
| EP | 0713359 A1 | 5/1996 |
| GB | 2134026 A | 8/1984 |
| JP | 3-122580 | 12/1991 |
| JP | 4-315401 | 11/1992 |
| JP | 9-96746 | 4/1997 |
| JP | 10-282351 | 10/1998 |
| TW | 089110428 | 1/1998 |
| WO | WO 90/01176 | 2/1990 |
| WO | WO 00/50946 | 8/2000 |

OTHER PUBLICATIONS

Search Report Dated Mar. 26, 2003 for corresponding EP Application EP 00931602.
Copy of Official Action of Taiwan Patent Office dated Nov. 15, 2001 and English translation thereof.

* cited by examiner

*Primary Examiner*—Akm Enayet Ullah
*Assistant Examiner*—Jerry T Rahll
(74) *Attorney, Agent, or Firm*—Staas & Halsey LLP

(57) ABSTRACT

An optical-electric printed wiring board includes an electric wiring substrate having electric interconnects, and an optical wiring layer stacked on the electric wiring substrate and having a surface on which an optical part is mounted. The optical wiring layer includes a core for propagating light, a clad for sandwiching the core, and a mirror for reflecting light propagating in the core toward an optical part mounted on the optical wiring layer, or reflecting light from an optical part into the core. The electric wiring substrate includes conductive setting portions each of which extends through the optical wiring layer in the direction of stacking and has an end face on which an optical part is set. These conductive setting portions obtain electrical conduction between the optical part and the electric interconnects.

18 Claims, 19 Drawing Sheets

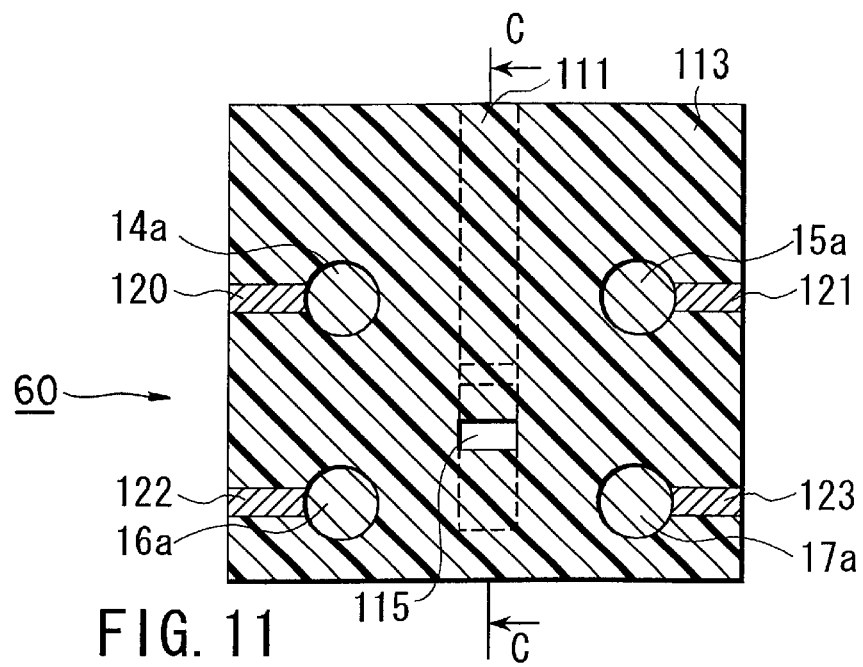
FIG. 11
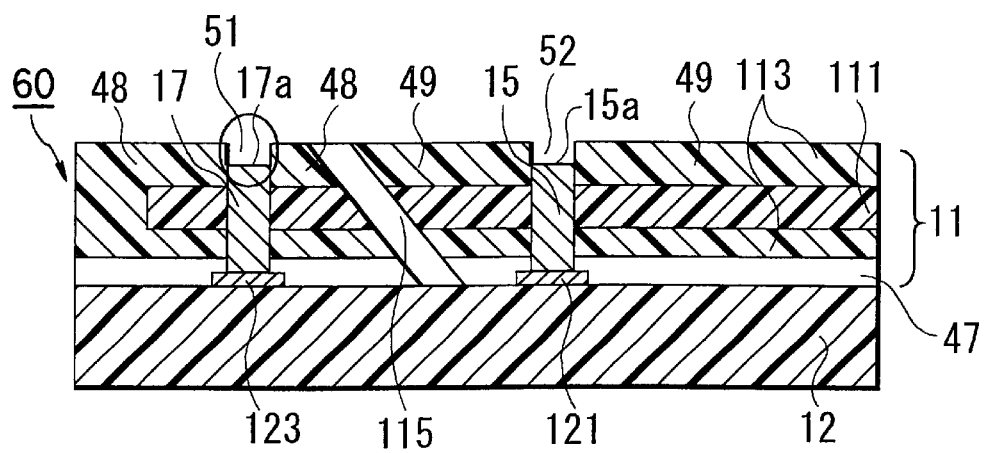
FIG. 12A
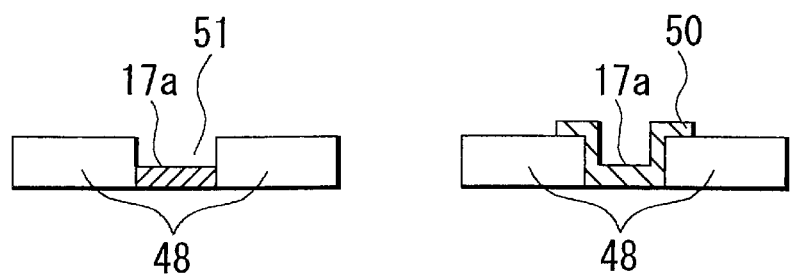
FIG. 12B
FIG. 12C

OPTICAL-ELECTRIC PRINTED WIRING BOARD, PRINTED CIRCUIT BOARD, AND METHOD OF FABRICATING OPTICAL-ELECTRIC PRINTED WIRING BOARD

CROSS REFERENCE TO RELATED APPLICATIONS

This is a Continuation Application of PCT Application No. PCT/JP00/03440, filed May 29, 2000, which was not published under PCT Article 21(2) in English.

This application is based upon and claims the benefit of priority from the prior Japanese Patent Applications No. 11-150460, filed May 28, 1999; and No. 11-150461, filed May 28, 1999, the entire contents of both of which are incorporated herein by reference.

BACKGROUND OF THE INVENTION

1. Field of the Invention

The present invention relates to an optical-electric printed wiring board having both optical interconnects and electric interconnects, a method of fabricating the same, and a printed circuit board fabricated by mounting an optical part or an electric part on the optical-electric printed wiring board.

2. Description of the Related Art

Recently, the degree of integration of transistors is increasing, among other electric elements such as semiconductor large-scale integrated circuits (LSIs). Some transistors have an operating speed of 1 GHz as a clock frequency.

To mount these highly integrated electric elements on an electric printed wiring board, packages such as a BGA (Ball Grid Array) and a CSP (Chip Size Package) have been developed and put into practical use.

Generally, as the internal clock frequency of electric elements rises, the external inter-element signal speed of these electric element rises. This high-speed, inter-element signal produces noise such as reflection caused by poor shapes of electric interconnects connecting the elements, or the influence of crosstalk. In addition, the high-speed inter-element signal generates many electromagnetic waves from the electric interconnects to adversely affect peripheral circuits. Therefore, present systems are constructed by lowering this signal speed between electric elements to the extent at which no such problems arise. In this case, however, the functions of highly integrated electric elements are not fully utilized.

To solve these problems, copper electric interconnects on a printed circuit board are partially replaced with optical interconnects such as optical fibers or optical waveguides, and optical signals are used in place of electrical signals. This is because optical signals can suppress the generation of noise and electromagnetic waves.

From the viewpoint of high-density mounting and miniaturization, it is desirable to fabricate an optical-electric printed wiring board by stacking electric interconnects and optical interconnects on the same substrate. However, when an optical part such as a laser light emitting element or light receiving element is to be mounted on a conventional optical-electric printed wiring board, it is difficult to optically align the optical axis of this optical part with that of an optical interconnect. Generally, only a skilled operator can align these optical axes. Accordingly, compared to electric parts which can be automatically soldered by a reflow furnace or the like, mounting optical parts on an optical-electric printed wiring board is very expensive.

BRIEF SUMMARY OF THE INVENTION

The present invention has been made in consideration of the above drawbacks of the prior art, and has as its object to provide an optical-electric printed wiring board which can realize high-density mounting or miniaturization, and which can mount an optical part and an electric part with high accuracy, to provide a method of fabricating the same, and to provide a printed circuit board mounting an optical part or an electric part on the optical-electric printed wiring board.

One aspect of the present invention is an optical-electric printed wiring board comprising an electric wiring substrate having an electric interconnect, and an optical wiring layer stacked on the electric wiring substrate and having a surface on which an optical part is mounted, characterized in that the optical wiring layer comprises a core for propagating light, a clad for sandwiching the core, and a mirror for reflecting light propagating in the core toward the optical part, or reflecting light from the optical part into the core, and the electric wiring substrate comprises conductive setting means which is a conductor column extending through the optical wiring layer in the direction of stacking and having an end face on which the optical part to be mounted is set, the conductive setting means obtaining electrical conduction between the optical part to be mounted and the electric interconnect.

Another aspect of the present invention is a printed circuit board fabricated by mounting an optical part or an electric part on the optical-electric printed wiring board described above.

Still another aspect of the present invention is a method of fabricating an optical-electric printed wiring board, characterized by comprising the steps of forming conductive setting means on a predetermined electric interconnect of an electric wiring substrate, coating the electric wiring substrate with a first cladding layer, coating the first cladding layer with a core layer, coating a portion of the first cladding layer and the core layer with a second cladding layer to obtain an optical wiring layer, exposing an end face of the conductive setting means from the optical wiring layer, forming an electric interconnect on the optical wiring layer, and forming a mirror in a predetermined position of the optical wiring layer by perforation.

With the arrangements as described above, it is possible to provide an optical-electric printed wiring board which can realize high-density mounting or miniaturization, and which can mount an optical part and an electric part with high accuracy, to provide a method of fabricating the same, and to provide a printed circuit board fabricated by mounting an optical part or an electric part on the optical-electric printed wiring board.

Note that embodiments according to the present invention include inventions in various stages, and diverse inventions can be extracted by proper combinations of a plurality of constituent features disclosed. For example, if an invention is extracted by omitting some constituent features from all constituent features described in the embodiments, the extracted invention is carried out by properly compensating for the omitted portions by well-known conventional techniques.

BRIEF DESCRIPTION OF THE SEVERAL VIEWS OF THE DRAWING

FIG. 11 is a top view showing, from the optical part mounting side, an optical-electric printed wiring board 60 according to the second embodiment;

FIG. 12A is a sectional view taken along a direction C—C in FIG. 11;

FIGS. 12B and 12C are enlarged views showing a recess 51 and its vicinity;

DETAILED DESCRIPTION OF THE INVENTION

Figure 1:
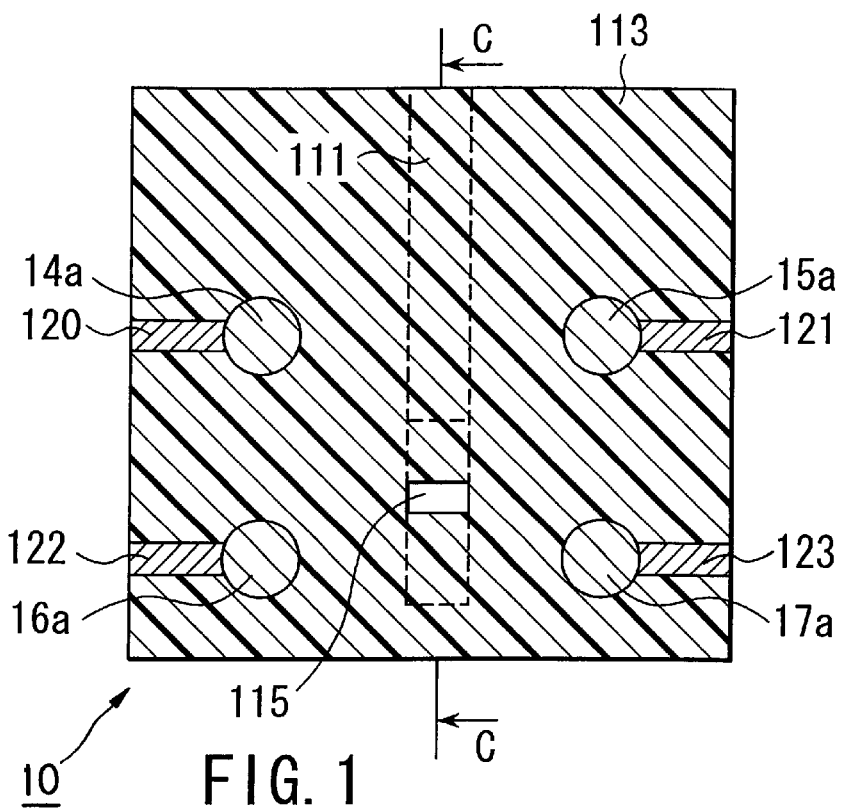
FIG. 1 is a top view showing, from the optical part mounting side, an optical-electric printed wiring board 10 according to the first embodiment.

Four best modes for carrying out the present invention will be described in turn with reference to the accompanying drawings. In the following description, the same reference numerals denote components having substantially the same functions and arrangements, and a duplicate explanation will be made only where necessary.

(First Embodiment)

An important point of an optical-electric printed wiring board according to the first embodiment is the idea that an optical wiring layer for mounting an optical part (optical element) and a substrate having electric interconnects are stacked.

FIG. 1 is a top view showing, from the optical part mounting side, an optical-electric printed wiring board 10 according to the first embodiment.

Figure 2:
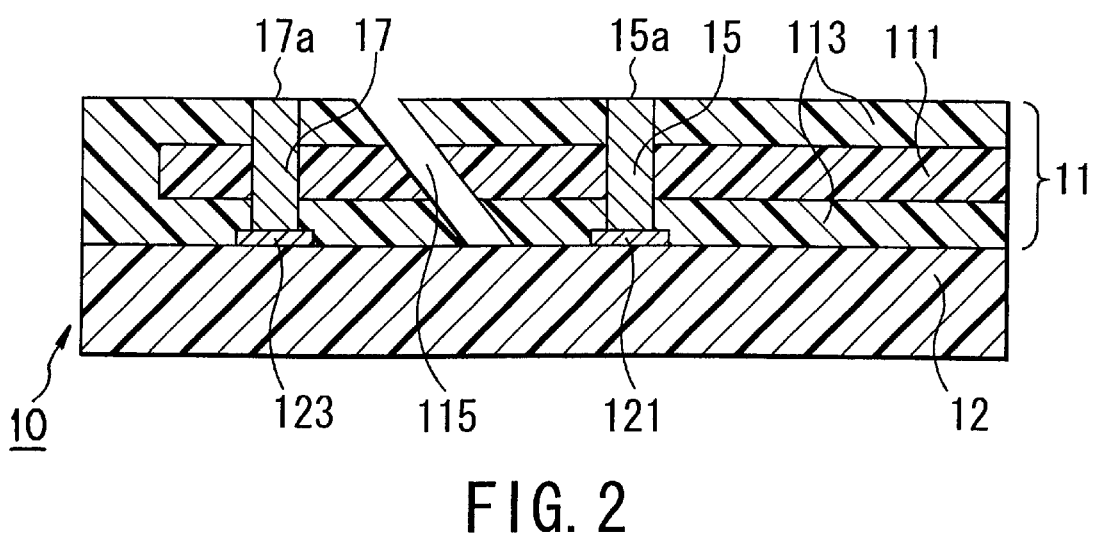
FIG. 2 is a sectional view taken along a C—C direction in FIG. 1.

FIG. 2 is a sectional view taken along a direction C—C in FIG. 1.

As shown in FIGS. 1 and 2, the optical-electric printed wiring board 10 has a structure in which an optical wiring layer 11 is stacked on a substrate 12.

First, the arrangement of this optical-electric printed wiring board 10 will be explained with reference to FIGS. 1 and 2, in the order of an optical wiring system, an electric wiring system, and connecting means for electrically connecting an optical part or the like mounted on the optical wiring layer 11 and the electric wiring system.

The optical wiring layer 11 includes a core 111 through which an optical signal propagates, and a clad 113 confined in this core 111. The pattern of the core 111 is formed by photolithography as will be described later. The position of the core 111 can be determined by alignment marks (not shown) formed on a support substrate. When the refractive index of the material forming the core 111 is made higher than that of the clad 113, an optical signal propagates in the core 111.

As the material of the core 111, it is possible to select a resin having a refractive index suited to a wavelength to be guided. Examples are a fluorine-based polyimide resin and a polymethylmethacrylate resin.

The material of the clad 113 can be, e.g., a fluorinated polyimide-based resin or a fluorinated epoxy-based resin.

Figure 3:
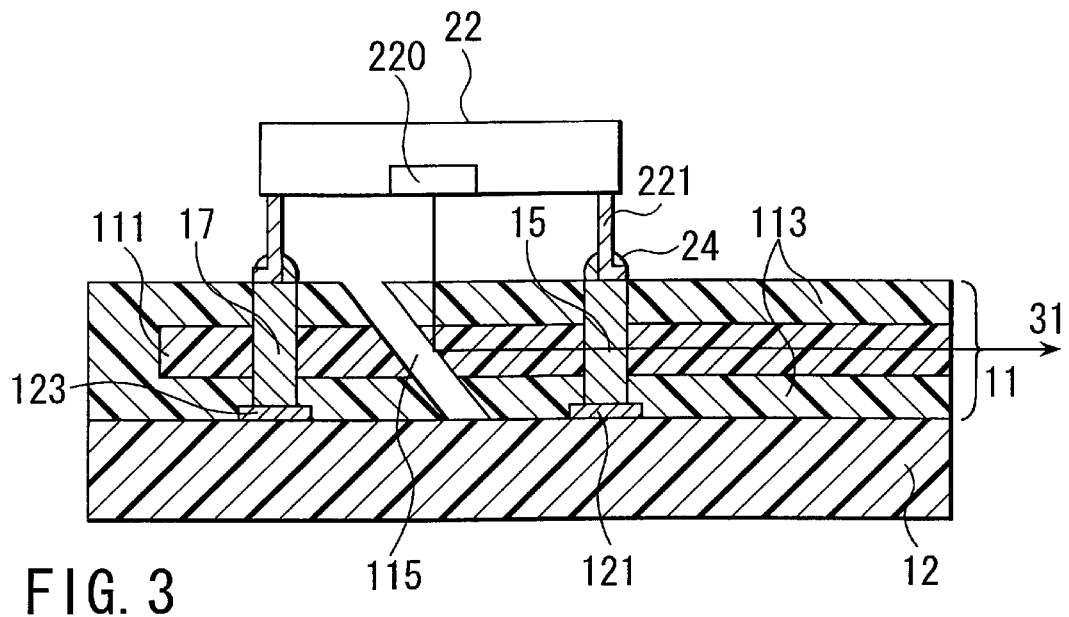
FIGS. 3 and 4 show a printed circuit board mounting an optical part on the optical-electric printed wiring board 10 according to the first embodiment.
Figure 4:
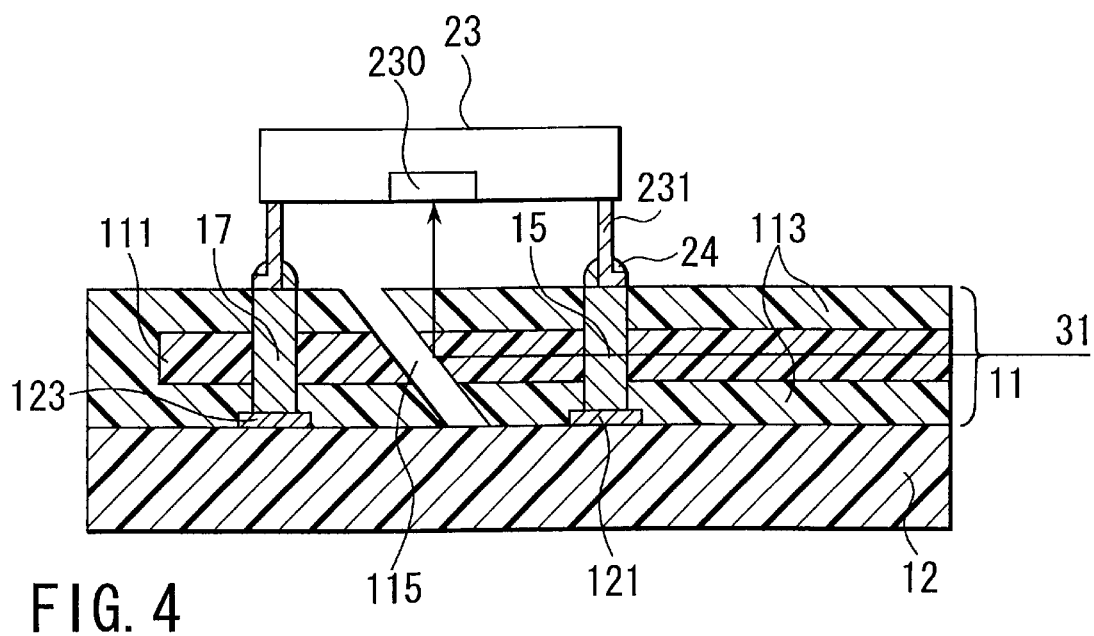

The core 111 has a mirror 115 so formed that the incident angle of an optical signal is 45°. An optical signal propagates between the core 111 and an optical part (e.g., a laser diode or photodiode) via this mirror 115 (FIGS. 3 and 4). The mirror 115 can be formed by perforation by etching or a laser, by using a metal mask formed on the optical wiring layer by photolithography. The position of this mirror 115 can be determined by alignment marks (not shown) formed on the substrate 12. The interface (a surface away from the core 111) of the mirror 115 is brought into contact with a resin having a refractive index lower than that of the core 111, or with the air. A thin metal film can also be formed on this interface.

The substrate 12 has electric interconnects 120, 121, 122, and 123 on its surface. This substrate 12 can be either a single-layered insulating substrate or a multilayered electric wiring substrate. As the material of the substrate 12, it is possible to use, e.g., a polyimide film, a substrate formed by impregnating a glass cloth with an epoxy resin or the like, or a ceramic substrate.

In a peripheral portion of the mirror 115, conductive projections 14, 15, 16, and 17 are formed to extend through the optical wiring layer 11 in the stacking direction.

These conductive projections 14, 15, 16, and 17 are electrical connecting means for electrically connecting an optical part (laser light emitting element or light receiving element) and the electric interconnects 120, 121, 122, and 123, respectively. An optical part or the like is directly soldered to end faces 14a, 15a, 16a, and 17a (FIG. 1), on the side of the optical wiring layer 11, of these conductive projections 14, 15, 16, and 17, respectively. If necessary, these end faces 14a, 15a, 16a, and 17a can be surface-treated, e.g., plated with Ni/Au.

The optical-electric printed wiring board according to the present invention mounts an electric part such as an IC as well as an optical part. When this is the case, an electric part is electrically connected to the electric interconnects 120, 121, 122, and 123 on the substrate 12 via the conductive projections 14, 15, 16, and 17, respectively.

These conductive projections are formed using photolithography and plating. Accordingly, the formation positions can be determined by alignment marks (not shown) formed on the substrate 12. The number of conductive projections usually corresponds to the number of connecting terminals 221 of an optical part or the like. However, the number of conductive projections can also be increased or decreased where necessary.

FIG. 3 is a sectional view in which the leads 221 of a laser light emitting element 22 such as a semiconductor laser are soldered by solder 24 onto the end faces 14a, 15a, 16a, and 17a of the conductive projections. As shown in FIG. 3, a laser beam 31 emitted from a laser emitting surface 220 of the laser light emitting element 22 is reflected by the mirror 115, and propagates in the core 111.

FIG. 4 is a sectional view in which leads 231 of a light receiving element 23 such as a photodiode are soldered by solder 24 onto the end faces 14a, 15a, 16a, and 17a of the conductive projections. As shown in FIG. 4, a laser beam 31 propagating in the optical wiring layer 11 is reflected by the mirror 115, and incident on a light receiving surface 230 of the light receiving element 23.

As described above, the relative positional relationship between the optical wiring core 111, the conductive projections 14, 15, 16, and 17 (or the end faces 14a, 15a, 16a, and 17a) for mounting an optical part, and the mirror 111 in the optical wiring layer 111 is determined on the basis of alignment marks (not shown). Therefore, the optical axis can be aligned with the intended one with extremely high accuracy. Also, the optical axis of an optical part can be optically aligned with that of the core 111 of the optical wiring layer 11 only by arranging leads of the optical part in the positions of the end faces 14a, 15a, 16a, and 17a of the conductive projections. Consequently, the optical part can be automatically soldered with ease in a reflow furnace or the like.

Note that conductive projections for soldering an electric part can also be formed on the optical wiring layer. Note also that electric interconnects can be additionally formed on the optical wiring layer 11. The arrangement of the conductive projections for an electric part can be the same as the optical part conductive projections described above.

If necessary, additional electric interconnects for electrically connecting an optical part or electric part and the conductive projections can also be formed on the optical wiring layer 11.

<First Fabrication Method of Optical-Electric Printed Wiring Board>

The first fabrication method of the optical-electric printed wiring board according to the present invention will be described below.

An outline of the optical-electric printed wiring board fabrication method according to the present invention is as follows.

First, conductive projections 14, 15, 16, and 17 are formed by photolithography and plating on a substrate 12 having electric interconnects 120, 121, 122, and 123.

On top of the resultant structure, a cladding layer 113a and a core layer 111a are formed in this order by coating.

Next, the core layer 111a is processed into a predetermined shape by photolithography and etching, thereby forming a core 111 as an optical interconnect.

In addition, the core 111 is coated with a cladding layer 113b to form a clad 113, obtaining an optical wiring layer 11.

After that, portions of the clad 113 on end faces 14a, 15a, 16a, and 17a of the conductive projections 14, 15, 16, and 17, respectively, are removed to expose these end faces on the surface of the optical wiring layer.

Furthermore, photolithography, plating, and etching are used to form electric interconnects and a metal mask opening for forming a mirror 115, and the mirror 115 is formed by dry etching.

A particularly important point of this fabrication method is that the optical wiring layer 11 is formed by directly mounting the clad 113, the core 111, and the like on the electric wiring substrate 12 having conductive projections. This idea can simplify the fabrication process and improve the fabrication efficiency.

The fabrication method of the optical-electric printed wiring board 10 shown in FIG. 2 will be described in more detail below with reference to the accompanying drawings. The explanation will be made with reference to FIGS. 5A to 5O by particularly focusing attention on the conductive projections 14, 15, 16, and 17 for mounting an optical part, which electrically connect to the electric interconnects 120, 121, 122, and 123 on the substrate 12.

Figure 5:
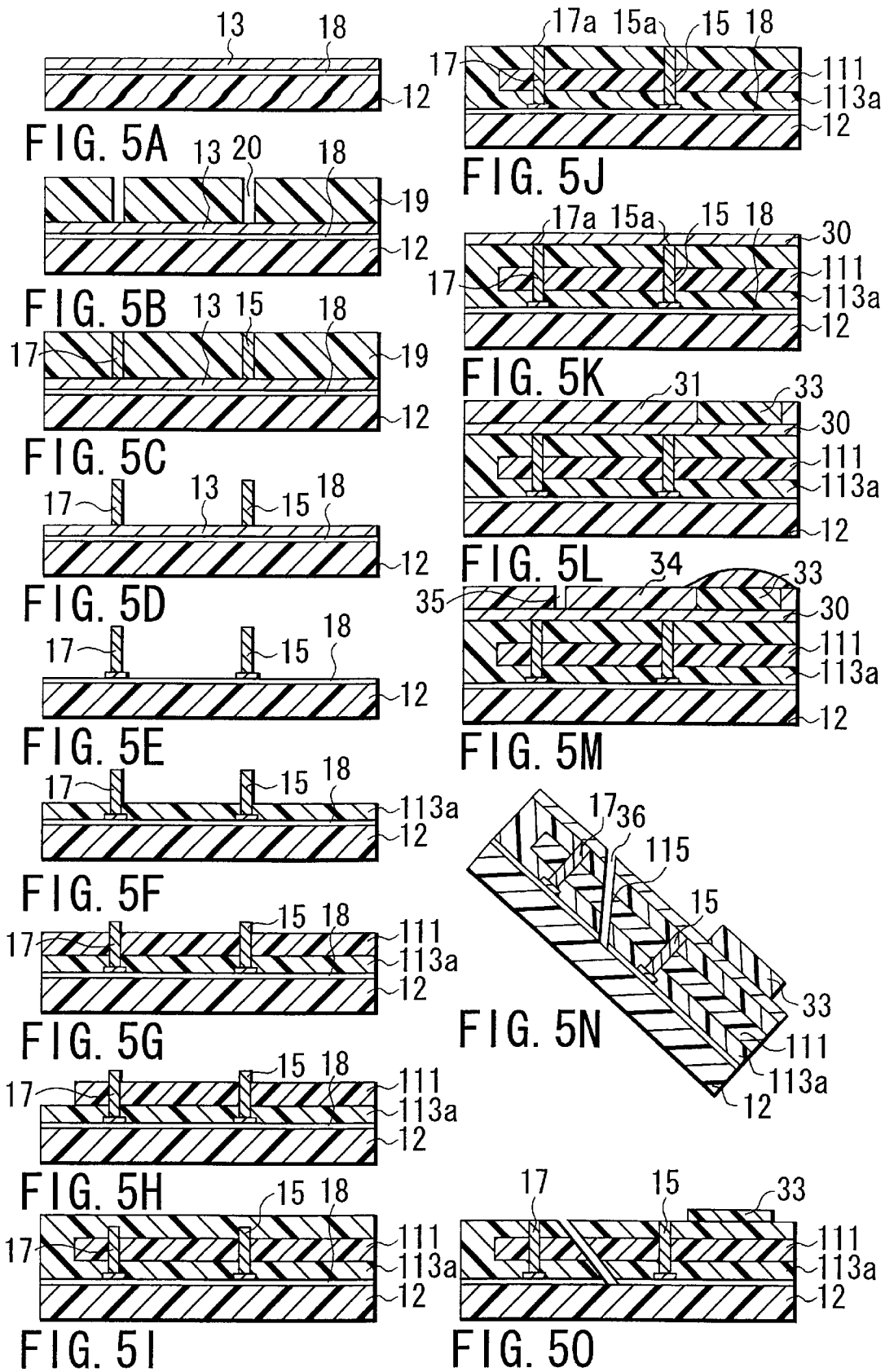
FIGS. 5A to 5O are sectional views showing the individual steps of a method of fabricating the optical-electric printed wiring board 10.

FIGS. 5A to 5O are views showing the individual steps of the fabrication method of an optical-electric printed wiring board 50. FIGS. 5A to 5O are arranged in the order of execution.

First, as shown in FIG. 5A, a metal thin-film layer 13 made of Cr and copper is formed by sputtering on a copper polyimide multilayered substrate 12 having a copper wiring layer 18.

As shown in FIG. 5B, PMER (manufactured by TOKYO OHKA KOGYO CO., LTD.) is formed to have a thickness of 40 $\mu$m as a photoresist 19 by roll coating. Exposure and development are performed to form openings 20 having a diameter of 100 $\mu$m.

Subsequently, the metal thin-film layer 13 is used as a cathode to plate copper to about the film thickness of the photoresist at room temperature in a copper sulfate bath. In addition, 2 $\mu$m of Ni and 0.05 $\mu$m of Au are formed by electroless plating, thereby forming conductive projections 14, 15, 16, and 17 (14 and 16 are not shown) as shown in FIG. 5C.

As shown in FIG. 5D, the photoresist 19 is removed by a dedicated stripping solution.

As shown in FIG. 5E, the metal thin-film layer 13 is removed by an etching solution.

As shown in FIG. 5F, polyimide OPI-N1005 (Hitachi Chemical Co., Ltd.) is formed by spin coating and imidized at 350° C., as a cladding layer 113a. The film thickness is 15 μm.

As shown in FIG. 5G, polyimide OPI-N1305 (Hitachi Chemical Co., Ltd.) is formed by spin coating and imidized at 350° C., as a core layer 111a. The film thickness is 8 μm.

Al is deposited on the surface of the core layer 111a. a predetermined pattern of a photoresist is formed, and an Al metal mask is formed by an etching solution. Furthermore, oxygen gas is used to etch the core layer 111a by reactive ion etching, thereby etching away the Al film to form a core 111 shown in FIG. 5H.

As shown in FIG. 5I, OPI-N1005 is formed by coating and imidized as a cladding layer 113b on the core 111. The film thickness of this cladding layer 113b is 15 μm on the core 111.

As shown in FIG. 5J, the outermost surface of this substrate is evenly dry-etched to expose end faces 14a, 15a, 16a, and 17a (14a and 16a are not shown) of the conductive projections.

As shown in FIG. 5K, a thin metal film 30 made of Cr and copper is formed on the dry-etched outermost surface by sputtering.

As shown in FIG. 5L, PMER is used as a photoresist 31, an opening for forming an electric interconnect 33 is formed, and the electric interconnect 33 is formed by electric copper plating.

The photoresist 31 is removed by a dedicated stripping solution. After that, as shown in FIG. 5M, a 2-μm thick photoresist 34 is again formed by spin coating, and an opening 35 for etching the underlying thin metal film 30 is formed.

As shown in FIG. 5N, a pattern 36 for mirror formation is formed in the thin metal film 30 by an etching solution, and the photoresist is removed by a dedicated stripping solution. After that, the substrate 12 is inclined 45°, and perforation is performed by reactive ion etching using oxygen gas, thereby forming a mirror 115.

As shown in FIG. 5O, the thin metal film 30 is etched away to complete the optical-electric printed wiring board 10 of the present invention.

A printed circuit board can be obtained by fixing an optical part (e.g., a laser or photodiode) and an electric part (e.g., a CPU or memory) to the optical-electric printed wiring board 10 obtained as described above, particularly to the end faces of the conductive projections, by using solder.

The following effects can be obtained from the above arrangement.

First, since the optical wiring layer 11 is formed on the substrate 12 having the electric interconnects 120, 121, 122, and 123, high-density mounting or miniaturization is possible.

Second, the relative positional relationship between the pattern of the core 111, the end faces 14a, 15a, 16a, and 17a of the conductive projections for mounting an optical part, and the mirror 115 can be matched with the intended one with extremely high accuracy. This facilitates aligning the optical axis of an optical part with that of the core 111 as an optical interconnect. As a consequence, an optical part and an electric part can be easily mounted.

Third, when an optical part or an electric part is to be soldered, the part is directly connected to the conductive projections 14, 15, 16, and 17 formed by plating. Therefore, the reliability of the connection can be improved without any influence of solder melting heat. At the same time, the reliability of the connection between each electric interconnect on the substrate 12 and the optical or electric part also improves.

Fourth, since electric interconnects can also be formed on the optical wiring layer 11 where necessary, interference between the electric interconnects can be further suppressed.

<Second Fabrication Method of Optical-Electric Printed Wiring Board>

The second fabrication method of the optical-electric printed wiring board 10 according to the present invention will be explained below.

Figure 6:
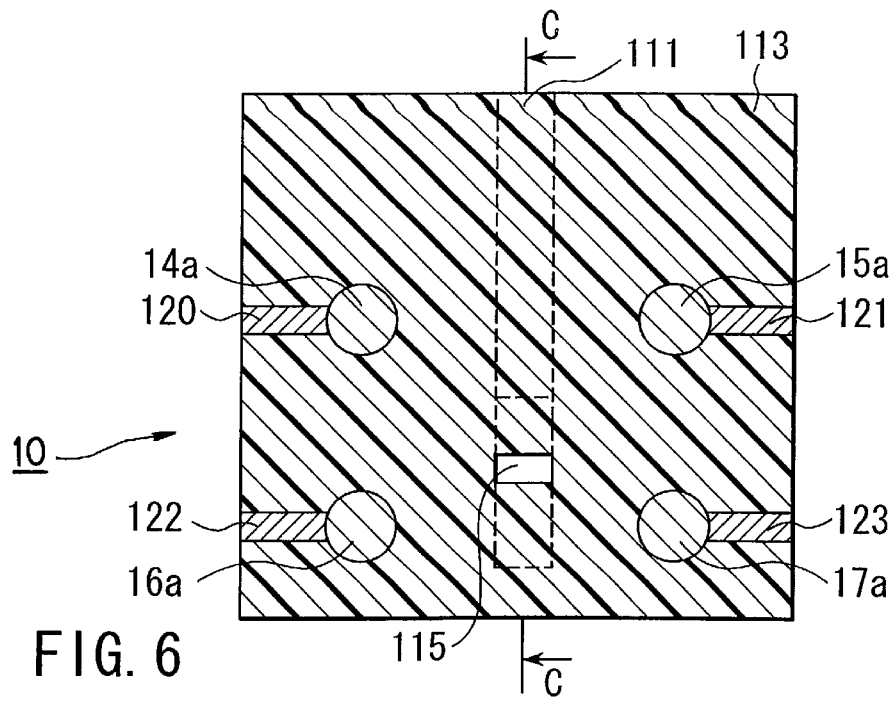
FIG. 6 is a plan view of a portion for mounting an optical part of the optical-electric printed wiring board obtained by the second fabrication method.
Figure 7A:
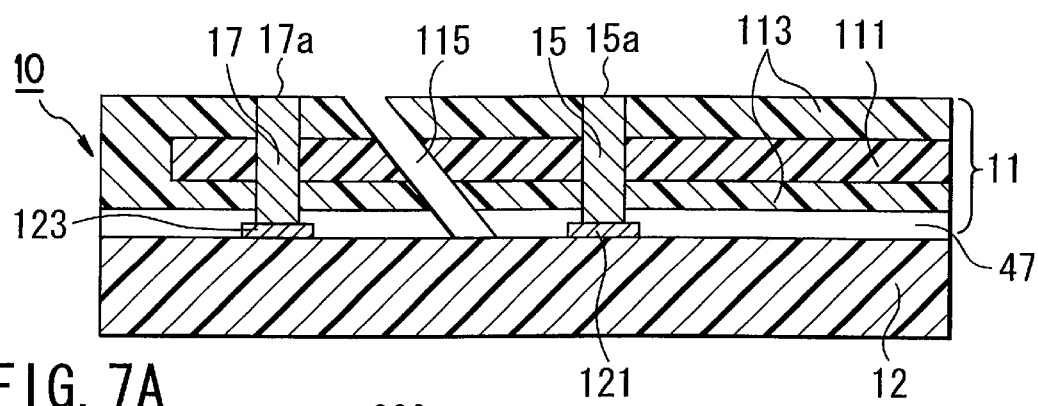
FIG. 7A is a sectional view taken along a C—C direction in FIG. 6.

FIG. 6 is a plan view of a portion where an optical part is to be mounted on the optical-electric printed wiring board 10 obtained by the second fabrication method. FIG. 7A is a sectional view taken along a direction C—C (along a core 111) in FIG. 6.

A particularly important point of this second fabrication method is that an optical wiring layer 11 and an electric wiring substrate 12 having conductive projections are separately fabricated and adhered via an adhesive layer, thereby fabricating the optical-electric printed wiring board 10.

Details of the second fabrication method will be described below with reference to the accompanying drawings, in the order of (1) an optical wiring layer fabrication method, (2) an electric wiring substrate fabrication method, and (3) an optical-electric printed wiring board fabrication method.

(1) Optical Wiring Layer Fabrication Method

A film-like optical wiring layer 11 is formed following the procedure shown in FIGS. 8A to 8E as will be explained below.

Figure 8A:
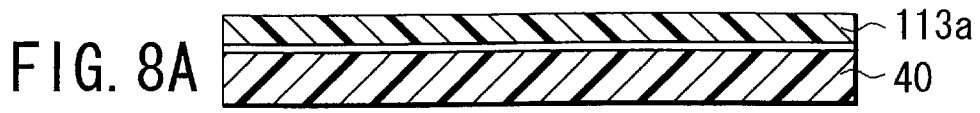
FIGS. 8A to 8E are sectional views showing the individual steps of a method of fabricating an optical wiring layer 11.

As shown in FIG. 8A, a silicon wafer 40 is coated with a cladding layer 113a about 20 to 50 μm thick. If this cladding layer 113a is a polyamic acid solution, the layer is calcined for 1 to 2 hr at 350° C. for imidization. If the cladding layer 113a is an epoxy-based resin, the layer is UV-cured or polymerized at 100 to 200° C.

Figure 8B:
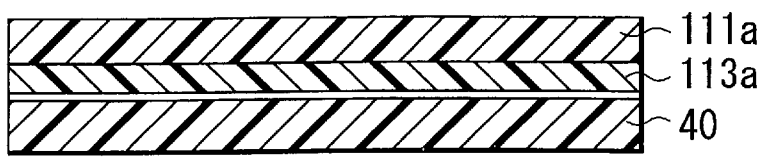

Next, as shown in FIG. 8B, an 8-μm thick core layer 111a serving as an optical waveguide is evenly formed by an appropriate coating method by selecting a resin, e.g., fluorine-based polyimide or a polymethylmethacrylate resin, having a refractive index suited to the wavelength to be guided.

Figure 8C:
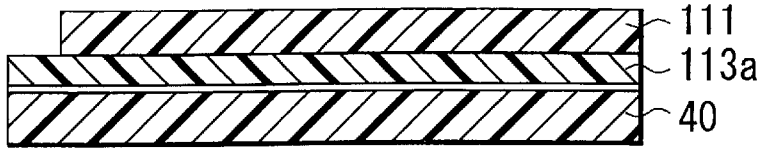

As shown in FIG. 8C, a core 111 is formed from the core layer 111a. Methods of forming this core 11 are classified into, e.g., the following two methods in accordance with whether or not the core layer 111a is photosensitive. That is, if the core layer 111a is photosensitive, the core 111 is formed by patterning by the conventional photolithography method, and cured in accordance with the material. If the core layer 111a is not photosensitive, after this core layer 111a is cured, a metal mask having a predetermined pattern is formed, and the pattern of the core 111 is formed by RIE dry etching.

After that, a cladding layer 113b about 20 to 50 μm thick is formed by coating by using the same material as the cladding layer 113a previously formed, obtaining a clad 113.

Figure 8D:
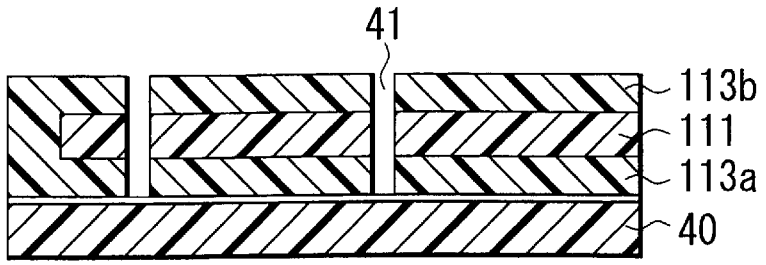

Subsequently, as shown in FIG. 8D, through holes 41 extending through an optical wiring layer made up of the core 111 and the clad 113 are formed in predetermined positions of this optical wiring layer. These holes 41 can be formed by irradiation with an excimer laser via a mask having a predetermined pattern.

Figure 8E:
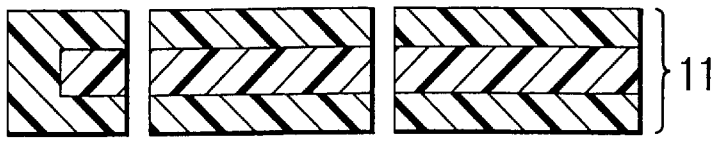

Finally, as shown in FIG. 8E, the film-like optical wiring layer 11 including the through holes 41 can be formed by peeling this optical wiring layer 11 from the silicon wafer 40.

In the above fabrication method, the through holes 41 are formed on the silicon wafer 40. Therefore, these through holes 41 can be readily formed with high accuracy. Also, the optical wiring layer 11 is peeled from the silicon wafer 40 after the through holes 41 are formed. Accordingly, tailings produced during the formation of the through holes 41 can be completely removed.

(2) Electric Wiring Substrate Fabrication Method

The electric wiring substrate fabrication method will be described with reference to FIGS. 9A to 9E.

Figure 9A:
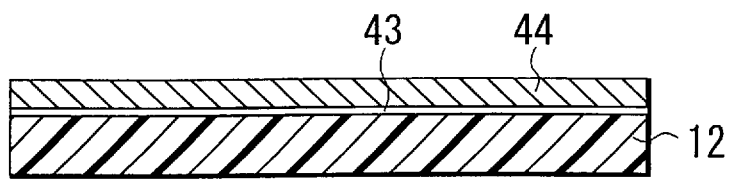
FIGS. 9A to 9E are sectional views showing the individual steps of a method of fabricating an electric wiring substrate 12.

As shown in FIG. 9A, on an appropriate insulating substrate 12 such as a glass epoxy substrate, a thin copper film about 20 $\mu$m thick is formed by, e.g., plating, sputtering, or evaporation. Also, a desired metal interconnect 43 is formed by the conventional photolithography method. To form conductive projections, a thin metal film 44 is formed by sputtering.

Figure 9B:
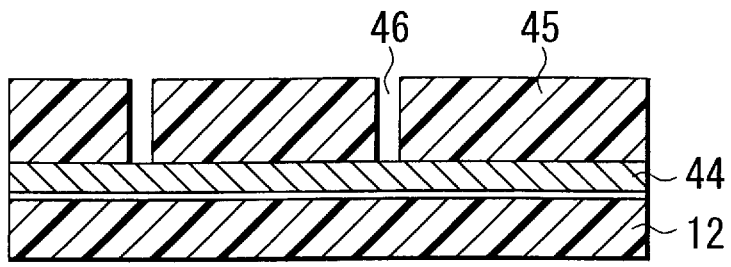

Next, as shown in FIG. 9B, the thin metal film 44 is coated with a resist 45, and this resist 45 is developed to form openings 46.

Figure 9C:
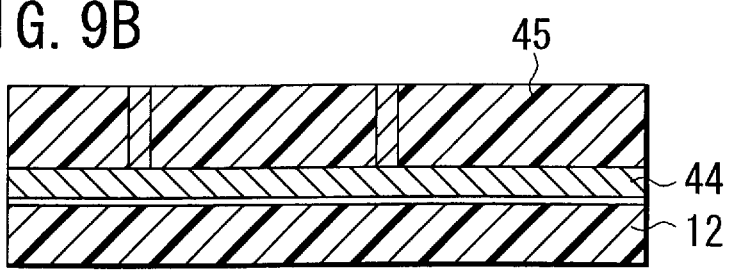

As shown in FIG. 9C, the thin metal film 44 is used as a cathode to perform copper plating, thereby filling the openings 46 with copper as much as possible.

Figure 9D:
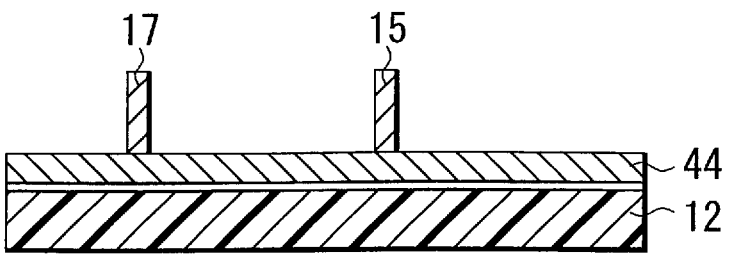

As shown in FIG. 9D, the resist 45 is removed.

Figure 9E:
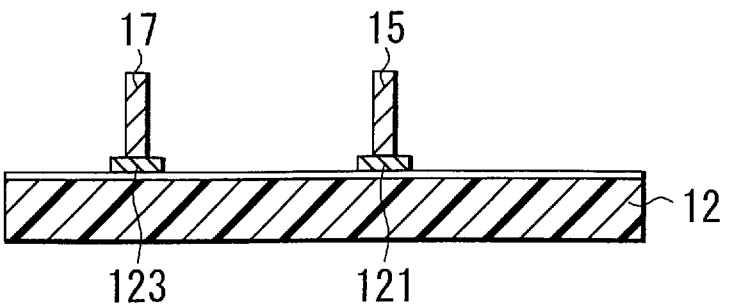

Finally, as shown in FIG. 9E, the thin metal film 44 is etched away. Consequently, electric interconnects 120, 121, 122, and 123 and conductive projections 14, 15, 16, and 17 on these electric interconnects can be formed (the electric interconnects 120 and 122 and the conductive projections 14 and 16 are not shown).

The shape of the through hole 41 which allows each conductive projection to extend through it can be selected from a column, a square pillar, or the like, in accordance with the shape of the mask. The height of this through hole 41 can be controlled by the film thickness of the resist 45 or the plating time. According to the experiment conducted by the present inventors, both the diameter and height are preferably about 50 to 100 $\mu$m.

(3) Optical-Electric Printed Wiring Board Fabrication Method

The method of stacking the optical wiring layer 11 on the electric wiring substrate 12 by using the conductive projections will be explained below with reference to FIGS. 10A to 10E.

Figure 10A:
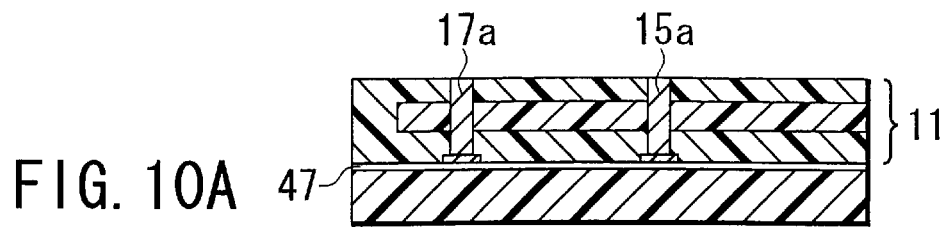
FIGS. 10A to 10E are sectional views showing the individual steps of a method of stacking the optical wiring layer 11 on the electric wiring substrate 12.

First, referring to FIG. 10A, the conductive projections 14, 15, 16, and 17 are used as alignment guides when the optical wiring layer 11 and the electric substrate 12 are stacked. That is, the optical wiring layer 11 and the electric substrate 12 are so stacked that the conductive projections made of a conductive metal or the like extend through the through holes 41 in the optical wiring layer 11. It is desirable that the optical wiring layer 11 and the electric substrate 12 be completely adhered by forming an adhesive layer 47 by coating on that side of the optical wiring layer 11, which comes in contact with the electric substrate 12. Accordingly, the conductive projections 14, 15, 16, and 17 have the function of support guides for the upper and lower substrates (the optical wiring layer 11 and the electric wiring substrate 12), and the function of electrically connecting the electric interconnects 120, 121, 122, and 123 and an optical part or the like mounted on the optical wiring layer 11.

Figure 10B:
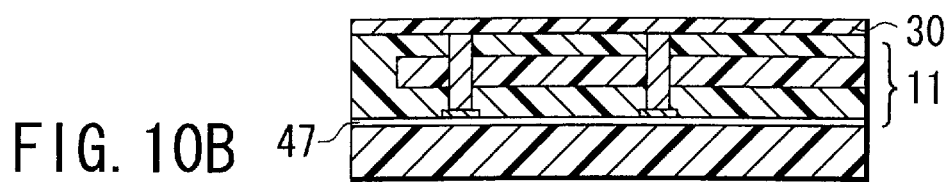

Next, as shown in FIG. 10B, a thin metal film 30 is formed by sputtering on the surface of the stacked optical wiring layer 11.

Figure 10C:
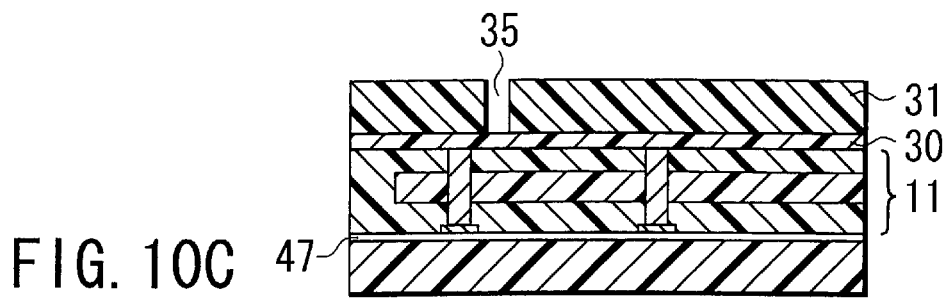

After this thin metal film 30 is coated with a photoresist 31, as shown in FIG. 10C, exposure and development are performed to form a photoresist opening 35 for mirror formation.

Figure 10D:
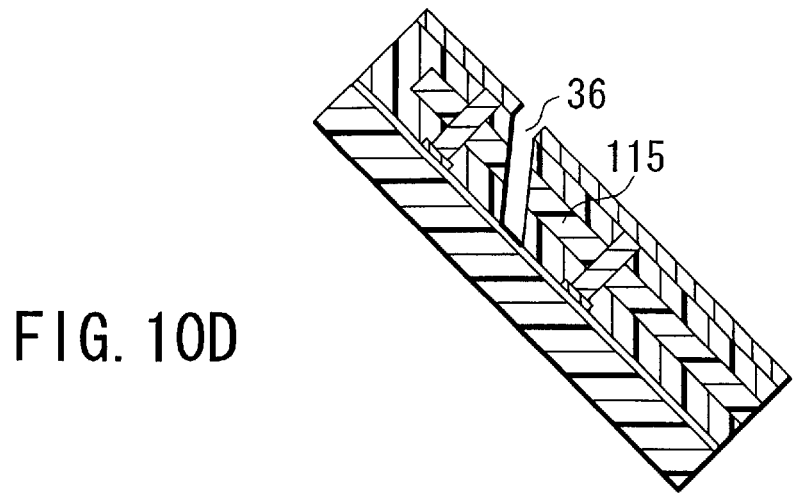

An opening 36 is then formed in the thin metal film 30 by etching, and a metal mask for mirror formation is formed. In addition, as shown in FIG. 10D, the substrate is inclined 45°, and a mirror 115 is formed by RIE dry etching.

Figure 10E:
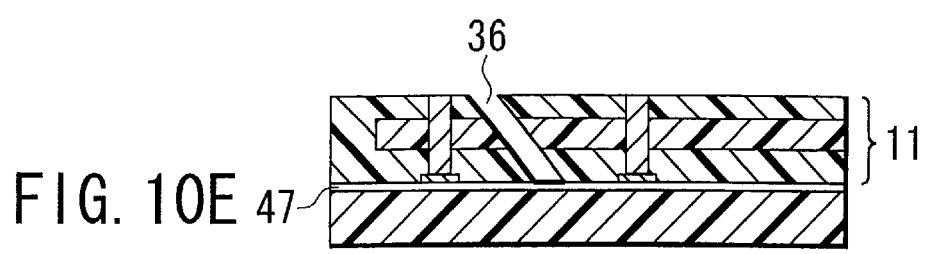

Finally, as shown in FIG. 10E, the metal mask is dissolved away to complete the optical-electric printed wiring board of the present invention.

In this second fabrication method, the optical wiring layer 11 and the electric wiring substrate 12 having the conductive projections are separately fabricated. Therefore, the mirror 115 having a shape shown in FIG. 7C can also be formed. That is, when the optical wiring layer 11 is to be independently formed, the mirror 115 having the shape shown in FIG. 7C can be formed by etching, a dicing saw, or the like by fixing the optical wiring layer 11 to a predetermined support after, e.g., the step shown in FIG. 8E.

(4) Printed Circuit Board Fabrication Method

A printed circuit board can be obtained by fixing an optical part (e.g., a laser or photodiode) and an electric part (e.g., a CPU or memory) to the optical-electric printed wiring board 10 obtained as described above, particularly to the end faces of the conductive projections.

Figure 7B:
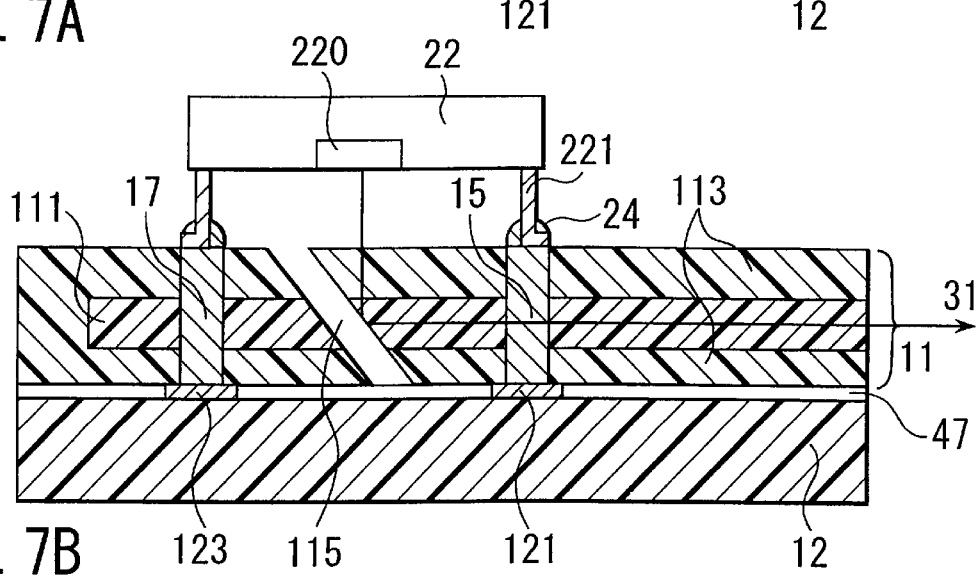
FIG. 7B shows a printed circuit board mounting an optical part on the optical-electric printed wiring board 10 according to the first embodiment.
Figure 7C:
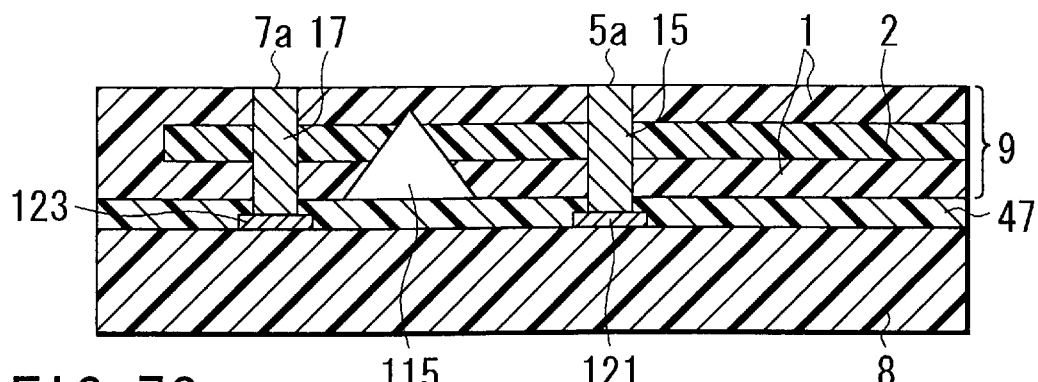
FIG. 7C shows another example of the optical-electric printed wiring board 10 according to the first embodiment.

FIG. 7B is a view showing a printed circuit board 9 fabricated by soldering terminals 221 of an optical part 22 containing a light emitting laser to the conductive projections 14, 15, 16, and 17 by solder 24.

In this printed circuit board 9 shown in FIG. 7B, the end faces 14a, 15a, 16a, and 17a (FIG. 6) of the conductive projections 14, 15, 16, and 17, respectively, are used as pads. As described previously, the conductive projections 14, 15, 16, and 17 are used to obtain electrical conduction between an optical part such as a semiconductor laser and the electric interconnects 120, 121, 122, and 123, and ensure alignment with the mirror 115. Accordingly, the reliability of the connection concerning optical waveguiding between the optical part and the optical wiring layer can be improved. This is so because the use of the end face of each conductive projection as a pad can assure highly accurate alignment, and the self-alignment effect can be obtained by solder connection.

As another desirable arrangement, metal pads conducting to the conductive projections 14, 15, 16, and 17 can also be formed on the optical wiring layer 11 by using photolithography.

In practice, the width of the optical wiring layer 11 and the mirror 115 is a few $\mu$m. Therefore, a laser beam must be reliably converged to this range. For this purpose, the end faces 14a, 15a, 16a, and 17a as metal pads to be connected to the terminals 221 of an optical part can also be recessed from their peripheral portion.

Furthermore, guides for guiding the connecting positions of the terminals 221 of an optical part can be formed around the end faces 14a, 15a, 16a, and 17a. These guides can be either conductive or insulating and are so formed as to surround the conductive projections 14, 15, 16, and 17 (i.e., the end faces 14a, 15a, 16a, and 17a).

These means for improving the accuracy of alignment between a laser beam and the mirror will be explained in detail later as the second to fourth embodiments.

Accordingly, the following effects can be obtained by the above-mentioned arrangement.

First, an optical wiring layer is formed on a substrate having electric interconnects, so high-density mounting or miniaturization is possible.

Second, the relative positional relationship between the pattern of the core 111, the end faces 14a, 15a, 16a, and 17a of the conductive projections for mounting an optical part, and the mirror 115 can be matched with the intended one with extremely high accuracy. This facilitates aligning the optical axis of an optical part with that of the optical wiring layer 11, without any alignment step. Furthermore, an optical part and an electric part can be automatically mounted at the same time.

Third, when an optical part or an electric part is to be soldered, the part is directly connected to the conductive projections formed by plating. Therefore, the reliability of the connection can be improved without any influence of solder melting heat. At the same time, the reliability of the connection between the electric interconnects 120, 121, 122, and 123 on the substrate 12 and the optical or electric part also improves.

Fourth, since electric interconnects can also be formed on the optical wiring layer 11 where necessary, interference between the electric interconnects can be further suppressed.

Fifth, the optical wiring layer 11 and the electric substrate 12 can be fabricated independently of each other. Furthermore, the optical wiring layer 11 can be easily and accurately stacked on the electric substrate 12 via the conductive projections as guides.

Sixth, in the fabrication process of the optical-electric printed circuit board 10, no tailings stay in the openings 41 for forming conductive projections. Hence, the optical wiring layer 11 and the electric wiring substrate 12 can be electrically reliably connected.

More specifically, if the openings 41 for forming conductive projections are formed by laser beam irradiation or plating, the following problems arise. First, tailings produced by thermal destruction of the resin component of the support of the electric wiring substrate stick to the metal film on the bottom of each opening 41 or to the circumferential surface of the opening 41. These tailings cannot be completely removed even through various cleaning steps. Second, the unremoved tailings interfere with electrical conduction between the conductive projection and the underlying thin metal film via the thin copper film covering the circumferential surface of the opening 41. Third, the adhesion of the thin copper-plated film of the conductive projection to the underlying optical wiring layer film is low. When an optical part is to be soldered, therefore, the thin copper-plated film readily peels upon heating. However, the above arrangement does not pose any of these problems.

The two methods of fabricating the optical-electric printed circuit board have been described above. By either of these two methods, optical printed wiring boards and printed circuit boards according to the second, third, and fourth embodiments to be described below can be fabricated.

Note that for the sake of brevity, examples obtained by only the second fabrication method described above are explained in the second, third, and fourth embodiments.

(Second Embodiment)

An optical-electric printed wiring board 60 according to the second embodiment will be described below.

An important point of the optical-electric printed wiring board according to this second embodiment is that guides for guiding the connecting positions of terminals 221 of an optical part is formed around end faces 14a, 15a, 16a, and 17a. With these guides, a laser beam emitted from or incident on an optical part is reliably converged to a desired range. As a consequence, the optical axis of a light emitting laser or the like and that of a mirror 115 having a width of a few μm can be accurately aligned. In addition, the optical part can be strongly fixed and, if necessary, can be electrically connected to electric interconnects on an electric wiring substrate 12.

FIG. 11 is a top view showing, from the optical part mounting side, the optical-electric printed wiring board 60 according to the second embodiment.

FIG. 12A is a sectional view taken along a direction C—C in FIG. 11.

As shown in FIGS. 11 and 12A, this optical-electric printed wiring board 60 has a structure in which guide portions 48 are formed on an optical wiring layer 11 of an optical-electric printed circuit board 10 described in the first embodiment. These guide portions 48 are formed by forming, e.g., recesses 51 and 53 in that surface of the optical wiring layer 11, which mounts an optical part or the like. Note that these recesses correspond to conductive projections. Although not shown, therefore, the optical-electric printed wiring board 60 has recesses other than these recesses 51 and 53.

Each recess is so formed that a terminal of an optical part can be smoothly accommodated, and desirably, soldered. When the shapes of the recess and a terminal of an optical part are similar to each other, the range within which the terminal is movable is restricted, so the object can be achieved more favorably. Note that conductive projections according to this embodiment are also formed by photolithography and plating. Therefore, the positions of these conductive projections can be determined by alignment marks (not shown) formed on the substrate 12.

Furthermore, the circumferential surface and upper peripheral portion of each recess can be surface-treated, e.g., plated with Ni/Au.

Figure 13:
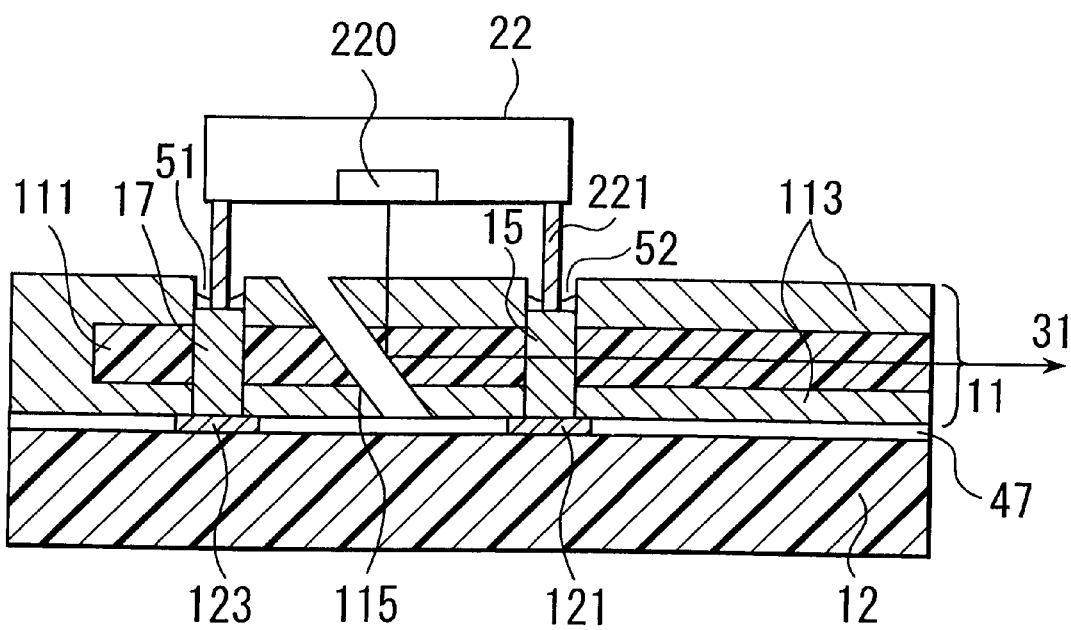
FIG. 13 is a top view showing, from the optical part mounting side, the optical-electric printed wiring board 60 according to the second embodiment.

FIGS. 12B and 12C are enlarged views showing the recess 51 and its vicinity. FIG. 12C particularly depicts an example in which the circumferential surface and peripheral portion of the recess 51 are subjected to a surface treatment, e.g., Ni/Au plating. FIG. 13 shows an example in which a laser light emitting element 22 is mounted on the optical printed wiring board 60.

As shown in FIG. 13, the tip of the terminal 221 of the laser light emitting element 22 is accommodated in a corresponding recess, and brought into contact with and soldered to the end face of a corresponding conductive projection. This can further improve the accuracy of alignment between the board 60 and the optical part or the like.

As especially shown in FIG. 12C, when the circumferential surface and vicinity of each recess are subjected to a surface treatment such as Ni/Au plating, the area for an electrical contact can be widened, and this can improve the reliability of the device.

<Fabrication Method of Optical-electric Printed Wiring Board>

The fabrication method of the optical-electric printed wiring board 60 according to the second embodiment will be described in detail below with reference to the accompanying drawings, in the order of (1) an optical wiring layer fabrication method, (2) an electric wiring substrate fabrication method, (3) an optical-electric printed wiring board fabrication method, and (4) a printed circuit board fabrication method.

(1) Optical Wiring Layer Fabrication Method

FIGS. 14A to 14E are sectional views showing the individual steps of the method of fabricating the optical-electric printed wiring board 60. FIGS. 14A to 14E are arranged in the order of execution.

Figure 14A:
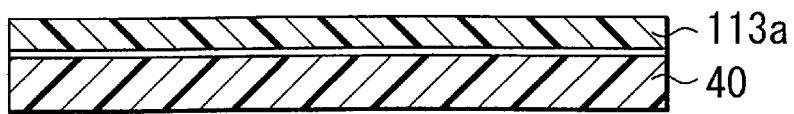
FIGS. 14A to 14E are sectional views showing the individual steps of a method of fabricating an optical wiring layer 11.

As shown in FIG. 14A, a silicon wafer 40 is coated with a cladding layer 113a (a support medium of an optical wiring layer for guiding light, e.g., fluorinated polyamic acid as a precursor of a fluorinated polyimide-based resin or a fluorinated epoxy-based resin is used) about 20 to 100 µm thick. If this cladding layer 113a is a polyamic acid solution, the layer is calcined for 1 to 2 hr at 350° C. for imidization. If the cladding layer 113a is an epoxy-based resin, the layer is UV-cured or polymerized at 100 to 200° C.

Figure 14B:
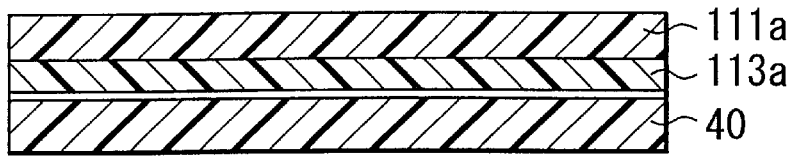
Figure 14C:
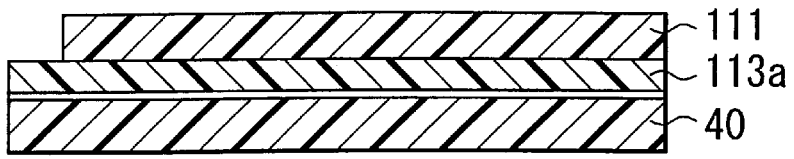

Next, as shown in FIG. 14B, an 8-µm thick core layer 111a serving as an optical waveguide is evenly formed by an appropriate coating method by selecting a resin, e.g., a fluorine-based polyamic acid solution or a polymethylmethacrylate resin solution, having a refractive index suited to the wavelength to be guided As shown in FIG. 14C, if the core layer 111a is photosensitive, a core 111 is formed by patterning by the conventional photolithography method, and cured in accordance with the material. If the core layer 111a is not photosensitive, after this core layer 111a is cured, a metal mask having a predetermined pattern is formed, and a waveguide pattern is formed by RIE dry etching. In addition, a layer about 20 to 100 µm thick is formed by coating by using the same material as the cladding layer previously formed.

Figure 14D:
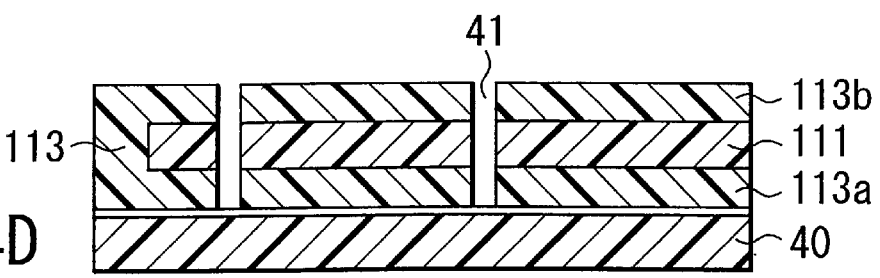

Subsequently, as shown in FIG. 14D, through holes 41 are formed in predetermined positions of the optical wiring layer. That is, these holes are formed by irradiation with an excimer laser via a mask having a predetermined pattern.

Figure 14E:
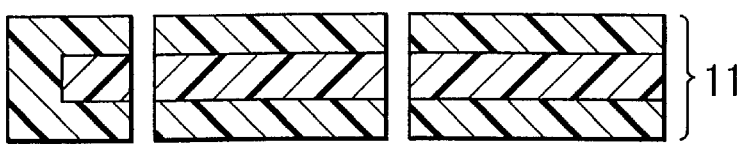

Finally, as shown in FIG. 14E, a film-like optical wiring layer 11 including the through holes 41 can be formed by peeling this optical wiring layer 11 from the silicon wafer 40. In this method, perfect through holes could be formed, and no tailings remained.

(2) Electric Wiring Substrate Fabrication Method

The method of fabricating the electric wiring substrate 12 will be described with reference to FIGS. 15A to 15E.

Figure 15A:
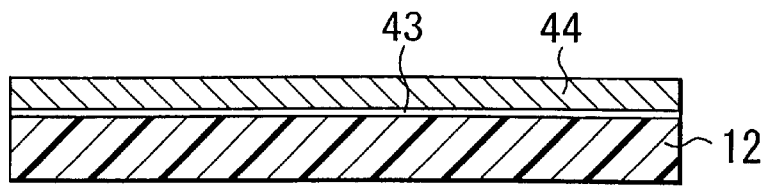
FIGS. 15A to 15E are sectional views showing the individual steps of a method of fabricating an electric wiring substrate 12.

As shown in FIG. 15A, on an appropriate insulating substrate 12 such as a glass epoxy substrate, a thin copper film about 20 µm thick is formed by, e.g., plating, sputtering, or evaporation. Also, a desired metal interconnect 43 (i.e., electric interconnects 120, 121, 122, and 123) is formed by the conventional photolithography method. To form conductive projections, a thin metal film 44 is formed by sputtering.

Figure 15B:
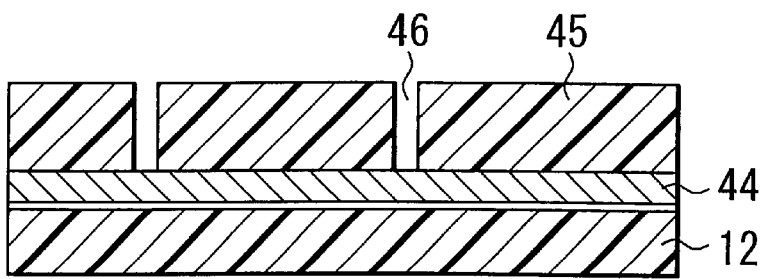

Subsequently, as shown in FIG. 15B, the thin metal film 44 is coated with a resist 45, and this resist 45 is developed to form openings 46.

Figure 15C:
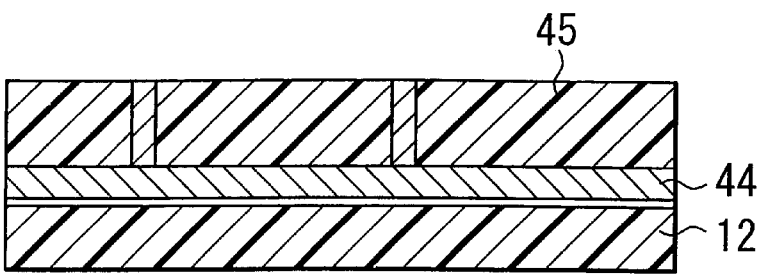

As shown in FIG. 15C, the thin metal film 44 is used as a cathode to perform copper plating, thereby filling the openings 46 with copper as much as possible.

Figure 15D:
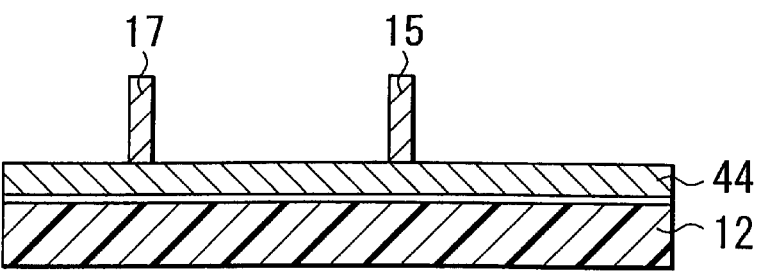

As shown in FIG. 15D, the resist 45 is removed.

Figure 15E:
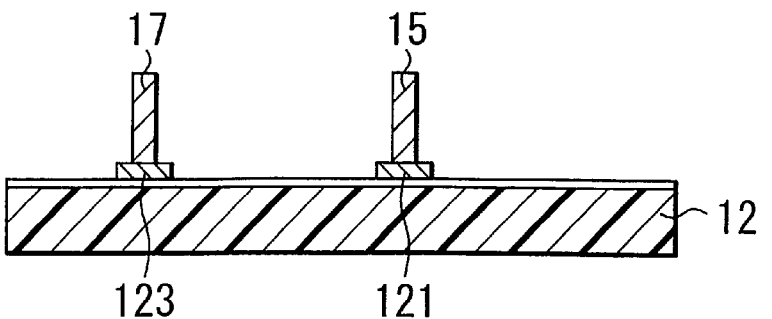

Finally, as shown in FIG. 15E, the thin metal film 44 is etched away to form conductive projections 14, 15, 16, and 17 (the conductive projections 14 and 16 are not shown) on the electric interconnect. Consequently, the electric wiring substrate 12 can be obtained.

The conductive projections are desirably formed using a mask having a shape, such as a column or a square pillar, matching the shape of a terminal of an optical part. The height of this conductive projection can be controlled by the film thickness of the resist or the plating time. According to the experiment conducted by the present inventors, the diameter and height of the conductive projection are preferably about 50 to 100 µm and about 20 to 200 µm, respectively.

(3) Optical-Electric Printed Wiring Board Fabrication Method

The method of stacking the optical wiring layer 11 on the electric wiring substrate 12 by using the conductive projections will be explained below with reference to FIGS. 16A to 16E.

Figure 16A:
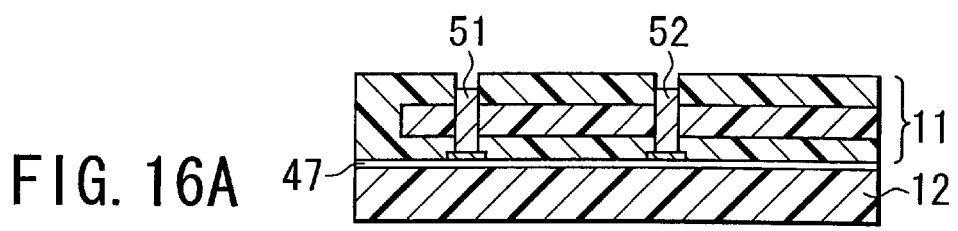
FIGS. 16A to 16E are sectional views showing the individual steps of a method of stacking the optical wiring layer 11 on the electric wiring substrate 12.

First, referring to FIG. 16A, a plurality of conductive projections are used as guides for stacking the optical wiring layer 11 on the electric substrate 12 by aligning these layer and substrate.

That is, the optical wiring layer 11 and the electric substrate 12 are so stacked that columns made of a conductive metal or the like extend to the middle of the film through the through holes 46 in the optical wiring layer 11. It is desirable that the optical wiring layer 11 and the electric substrate 12 be completely adhered by forming an adhesive layer 47 by coating on that side of the optical wiring layer 11, which comes in contact with the electric substrate 12. As shown in FIG. 16A, one or both of the film thickness of the optical wiring layer 11 and the height of the metal guide are adjusted such that the depth of the recess from the film surface is large enough to accommodate a terminal of an optical part, and desirably, 20 to 200 µm.

Figure 16B:
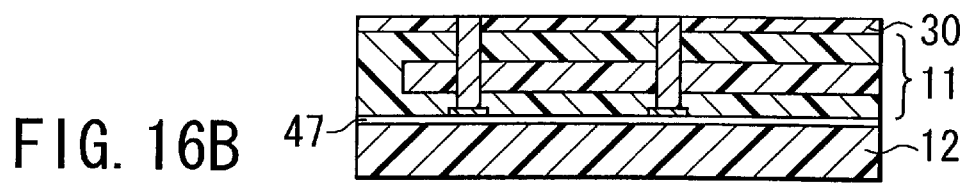

Next, as shown in FIG. 16B, a thin metal film 30 is formed by sputtering on the surface of the stacked optical wiring layer 11.

Figure 16C:
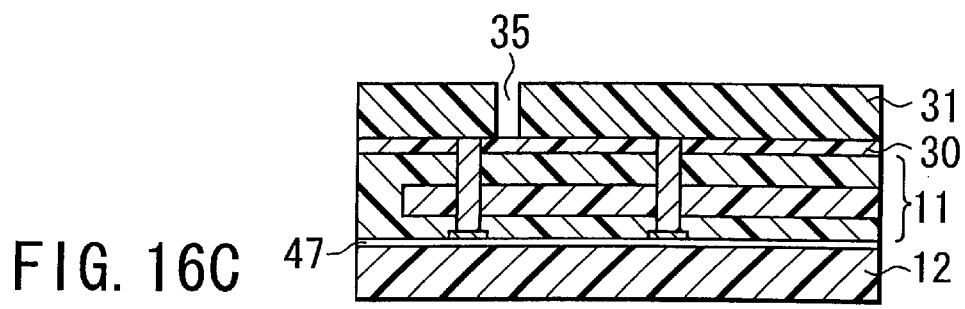

As shown in FIG. 16C, a photoresist 31 is formed by coating. Exposure and development are then performed to form a photoresist opening 35 for mirror formation.

Figure 16D:
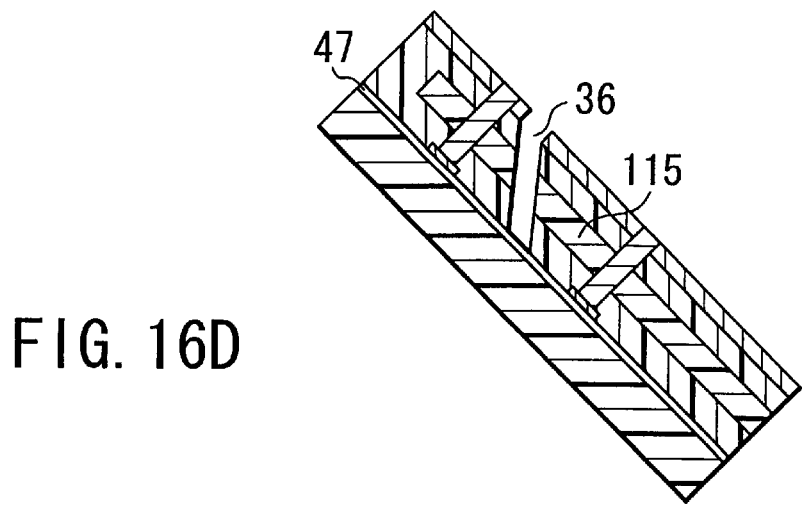

An opening 36 is formed in the thin metal film 30 by etching, and a metal mask for mirror formation is formed. In addition, as shown in FIG. 16D, the substrate is inclined 45°, and a mirror 115 is formed by RIE dry etching.

Figure 16E:
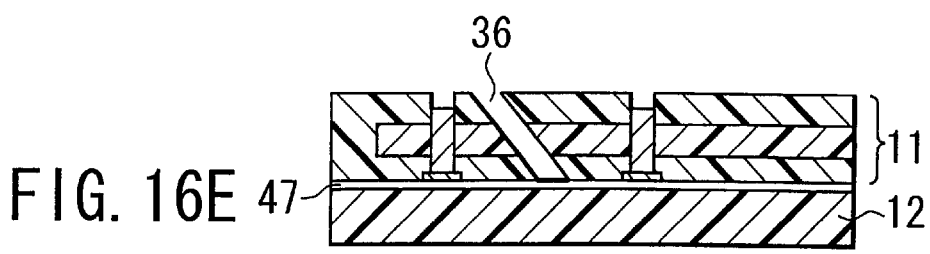

Finally, the metal mask is dissolved away to complete the optical-electric printed wiring board 60 as shown in FIG. 16E.

Another method of fabricating conductive projections is to perform laser beam irradiation or dry etching, from the optical wiring layer side, for appropriate positions on the optical-electric printed wiring board. The electric interconnect formed on the substrate 12 functions as a stopper, so the opening 36 (via hole) can be formed to this depth. Plating is subsequently performed to fill this opening 36 with a metal. When this plating is stopped in the middle of the optical wiring layer 11 by adjusting the plating time, a recess 51 having a desired depth can be formed. By this method, a recess can be formed deep enough to reach the electric wiring layer.

(4) Printed Circuit Board Fabrication Method

The method of fabricating a printed circuit board obtained by mounting an optical part on the optical-electric printed wiring board 60 according to the second embodiment will be described below (with reference to FIG. 13).

First, a solder ball is placed in a recess 50 and the like in the optical-electric printed wiring board, and a terminal 221 of an electric part (a laser or photodiode) is lightly inserted into the recess 50. Assume that the shape of the recesses 50, 51, and the like is a circle 80 µm in radius, and the depth of each recess is 50 µm. Note also that the number of conducting terminals 221 of an optical part is four, and the shape of each terminal is a circle 75 µm in radius. Terminals for an electric part (a CPU or memory) are placed on slightly soldered metal pads.

According to the experiment conducted by the present inventors, when the device was left to stand in a reflow furnace at a temperature of 250° for 10 seconds and then cooled, the terminals of an optical part were fixed in equilibrium positions determined by the shape of the recess and the surface tension of the molten solder, and the optical axis of the laser fell within the range of the central position of the mirror ±3 µm. When the terminals of an optical part were placed on flat metal pads having no recess similar to an electric part, the fixed positions of the optical part were unstable, and errors of about ±50 μm were produced. The recesses ensured highly accurate alignment between the electrical conduction and the mirror for optical wiring. In addition, the apexes of the conductive projections were directly electrically connected as pads to the optical part. Consequently, the reliability of the connection also improved.

Accordingly, the following effects can be obtained by the above-mentioned arrangement.

First, the optical wiring layer 11 is formed on the substrate 12 having electric interconnects, so high-density mounting or miniaturization is possible.

Second, the relative positional relationship between the pattern of the core 111 including the mirror 115 in the optical wiring layer 11 and the individual conductive projections for mounting an optical part can be matched with the intended one with extremely high accuracy.

Third, the terminal 221 of an optical part is accurately accommodated in each recess on the optical wiring layer 11. This facilitates optically aligning the optical axis of the optical part with that of the optical wiring layer 11. Therefore, an optical part and an electric part can be automatically mounted at the same time.

Fourth, when an optical part or an electric part is to be soldered, the part is directly connected to conductive projections formed by plating. Therefore, the reliability of the connection can be improved without any influence of solder melting heat. At the same time, the reliability of the connection between the electric interconnects on the substrate 12 and the optical or electric part also improves.

(Third Embodiment)

An optical-electric printed wiring board 62 according to the third embodiment will be described below.

An important point of the optical-electric printed wiring board 62 according to this third embodiment is the idea that end faces 14a, 15a, 16a, and 17a of conductive projections project to a predetermined height from the mounting surface of an optical wiring layer 11, and the projected ends of these conductive projections are connected to terminals of an optical part or the like (the shape of each terminal is preferably a recess, and more preferably, similar to the end faces 14a, 15a, 16a, and 17a).

When an optical part or the like is thus connected to the conductive projections, a laser beam emitted from or incident on the optical part is reliably converged to a desired range. As a consequence, as in the second embodiment, the optical axis of a light emitting laser or the like and that of a mirror 115 having a width of a few μm can be accurately aligned. In addition, the optical part can be strongly fixed and, if necessary, can be electrically connected to electric interconnects on an electric wiring substrate 12.

Figure 17:
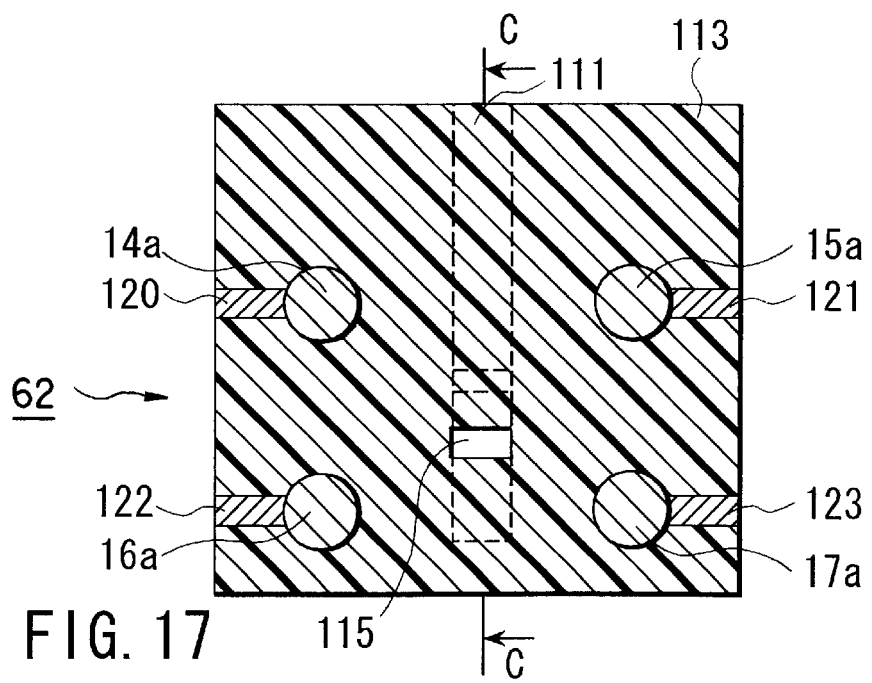
FIG. 17 is a top view showing, from the optical part mounting side, an optical-electric printed wiring board 62 according to the third embodiment.

FIG. 17 is a top view showing, from the optical part mounting side, an example of the optical-electric printed wiring board 62 according to the third embodiment.

Figure 18:
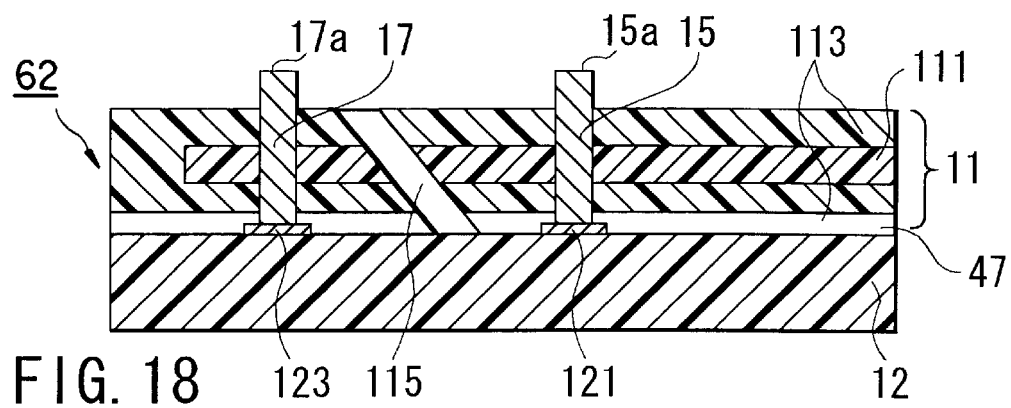
FIG. 18 is a sectional view taken along a direction C—C in FIG. 17.

FIG. 18 is a sectional view taken along a direction C—C in FIG. 17.

As shown in FIGS. 17 and 18, this optical-electric printed wiring board 62 has a structure in which, in addition to the structure of the optical-electric printed wiring board 10 described in the first embodiment, conductive projections 14, 15, 16, and 17 project to a predetermined height from the mounting surface of the optical wiring layer 11.

These conductive projections 14, 15, 16, and 17 are preferably a metal such as copper, because in this case they can conduct to electric interconnects 120, 121, 122, and 123 formed on the substrate 12. However, these conductive projections need not conduct to the electric interconnects and can also be simple struts.

Figure 19:
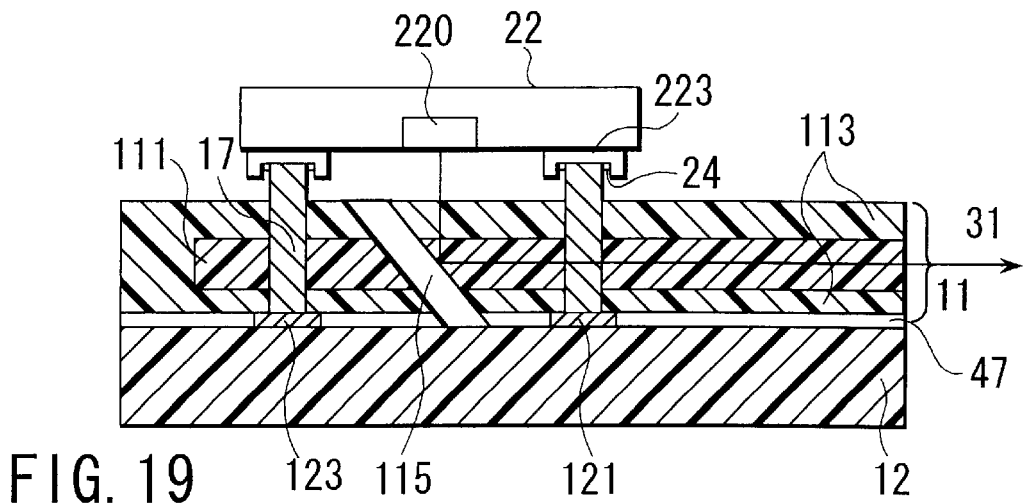
FIG. 19 shows a printed circuit board mounting an optical part on the optical-electric printed wiring board 62 according to the third embodiment.

As shown in FIG. 19, the conductive projections 14, 15, 16, and 17 projecting from the optical wiring layer 11 are smoothly accommodated in recesses in terminals 223 of an optical part 22, and the end portions of these conductive projections are soldered to the recesses of the optical part. Especially when the recess in the terminal 223 of the optical part and the end portion of each conductive projection have similar shapes and engage with each other, the range within which the optical part is movable is restricted. Accordingly, the optical axis of the light emitting laser 22 and that of the mirror 115 having a width of a few μm can be accurately aligned, and the light emitting laser 22 is strongly fixed. Also, electric interconnects additionally formed on the optical wiring substrate 11 can be electrically connected to the electric interconnects 14, 15, 16, and 17 where necessary.

The recess in the terminal 223 of the optical part 22 can be accurately formed by plating by using any conventional method such as bump formation. Furthermore, the reliability of the electrical connection can be further improved by performing a surface treatment, e.g., Ni/Au plating, for the end portions of the conductive projections 14, 15, 16, and 17.

Although not shown in FIG. 19, an electric part such as an IC is formed, if necessary, on the optical wiring layer 11 (or on the conductive projections) similar to an optical part, and electrically connected to the electric interconnects 120, 121, 122, and 123 via the conductive projections. Since these conductive projections are formed by photolithography and plating, their positions can be determined by alignment marks (not shown) formed on the substrate 12.

<Fabrication Method of Optical-electric Printed Wiring Board>

The fabrication method of the optical-electric printed wiring board 62 according to the third embodiment will be described in detail below with reference to the accompanying drawings, in the order of (1) an optical wiring layer fabrication method, (2) an electric wiring substrate fabrication method, (3) an optical-electric printed wiring board fabrication method, and (4) a printed circuit board fabrication method.

(1) Optical Wiring Layer Fabrication Method

FIGS. 20A to 20E are sectional views showing the individual steps of the method of fabricating the optical-electric printed wiring board 62. FIGS. 20A to 20E are arranged in the order of execution.

Figure 20A:
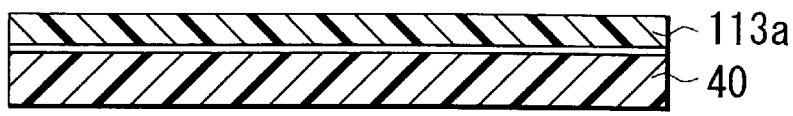
FIGS. 20A to 20E are sectional views showing the individual steps of a method of fabricating an optical wiring layer 11.

As shown in FIG. 20A, a silicon wafer 40 is coated with a cladding layer 113a (a support medium of an optical wiring layer for guiding light, e.g., fluorinated polyamic acid as a precursor of a fluorinated polyimide-based resin or a fluorinated epoxy-based resin is used) about 20 to 100 μm thick. If this cladding layer 113a is a polyamic acid solution, the layer is calcined for 1 to 2 hr at 350° C. for imidization. If the cladding layer 113a is an epoxy-based resin, the layer is UV-cured or polymerized at 100 to 200° C.

Figure 20B:
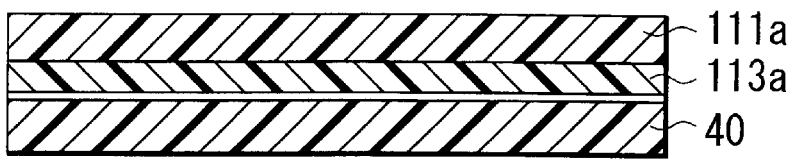

Next, as shown in FIG. 20B, an 8-μm thick core layer 111a serving as an optical waveguide is evenly formed by an appropriate coating method by selecting a resin, e.g., a fluorine-based polyamic acid solution or a polymethylmethacrylate resin solution, having a refractive index suited to the wavelength to be guided.

Figure 20C:
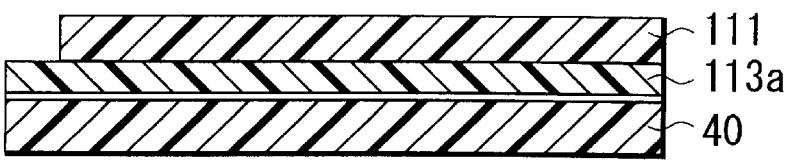

As shown in FIG. 20C, if the core layer 111a is photosensitive, a core 111 is formed by patterning by the conventional photolithography method, and cured in accordance with the material. If the core layer 111a is not photosensitive, after this core layer 111a is cured, a metal mask having a predetermined pattern is formed, and a waveguide pattern is formed by RIE dry etching.

Figure 20D:
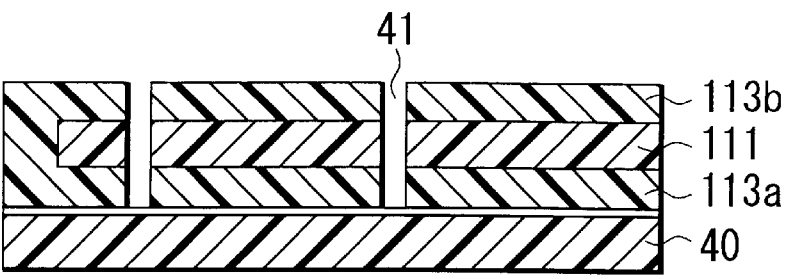

In addition, as shown in FIG. 20D, a portion of the cladding layer 113a previously formed and the core 111 are coated with a layer 113b about 20 to 100 μm thick made of the same material as the cladding layer 113a. Through holes 41 are then formed in predetermined positions. These holes 41 are formed by irradiation with an excimer laser via a mask having a predetermined pattern.

Figure 20E:
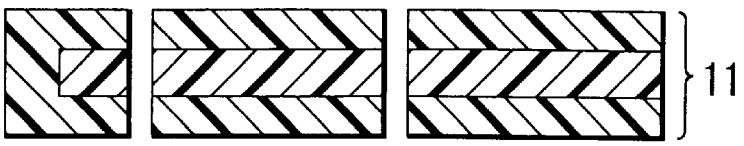

Finally, as shown in FIG. 20E, a film-like optical wiring layer 11 including the through holes 41 can be formed by peeling this optical wiring layer 11 from the silicon wafer 40.

In this method, perfect through holes 41 can be formed with no tailings left behind.

(2) Electric Wiring Substrate Fabrication Method

The method of fabricating the electric wiring substrate 12 will be described with reference to FIGS. 21A to 21E.

Figure 21A:
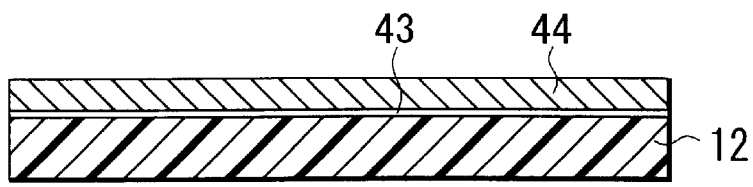
FIGS. 21A to 21E are sectional views showing the individual steps of a method of fabricating an electric wiring substrate 12.

First, as shown in FIG. 21A, on an appropriate insulating substrate 12 such as a glass epoxy substrate, a thin copper film about 20 μm thick is formed by, e.g., plating, sputtering, or evaporation. Also, a desired metal interconnect 43 (i.e., electric interconnects 120, 121, 122, and 123) is formed by the conventional photolithography method. In addition, to form a plurality of struts (conductive projections), a thin metal film 44 is formed by sputtering.

Figure 21B:
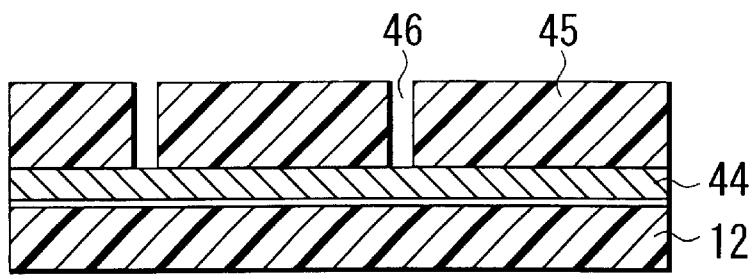

Subsequently, as shown in FIG. 21B, a dry film resist 45 is adhered to the thin metal film 44, and exposure and development are performed following the conventional procedures to form openings 46.

Figure 21C:
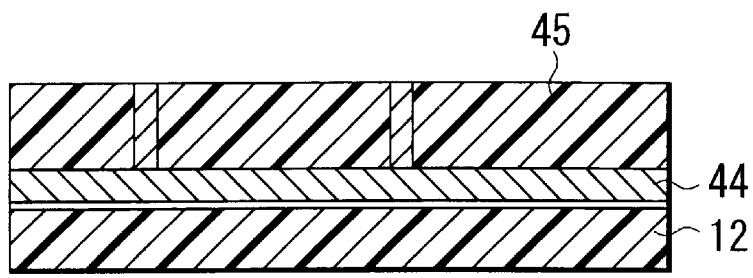

As shown in FIG. 21C, the thin metal film 44 is used as a cathode to perform copper plating, thereby filling the openings 46 with copper as much as possible.

Figure 21D:
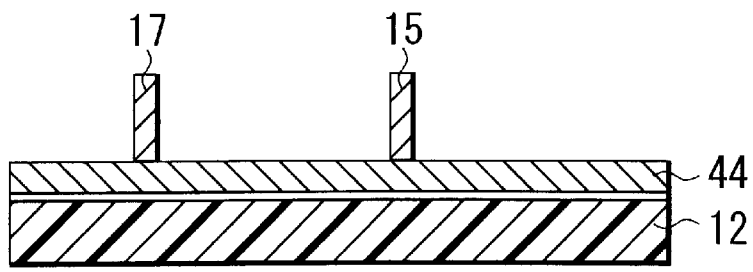

As shown in FIG. 21D, the resist 45 is removed.

Figure 21E:
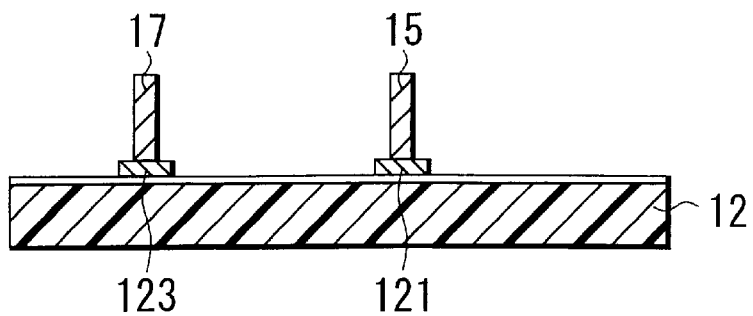

Finally, as shown in FIG. 21E, the thin metal film 44 is etched away to form conductive projections 14, 15, 16, and 17 (the conductive projections 14 and 16 are not shown) on the electric interconnect.

As in the second embodiment, the conductive projections are desirably formed using a mask having a shape, such as a column or a square pillar, matching the shape of a terminal of an optical part. The height of this conductive projection can be controlled by the film thickness of the resist or the plating time. According to the experiment conducted by the present inventors, the diameter and height of the conductive projection are preferably about 50 to 500 μm and about 20 to 200 μm, respectively.

(3) Optical-electric Printed Wiring Board Fabrication Method

The method of stacking the optical wiring layer 11 on the electric wiring substrate 12 by using the conductive projections will be explained below with reference to FIGS. 22A to 22E.

Figure 22A:
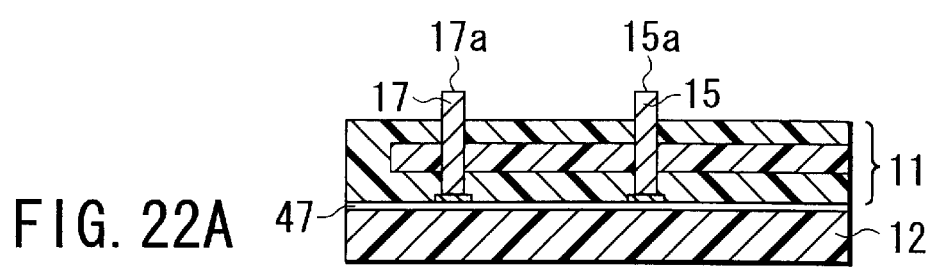
FIGS. 22A to 22E are sectional views showing the individual steps of a method of stacking the optical wiring layer 11 on the electric printed wiring board 12.

First, referring to FIG. 22A, the conductive projections are used for alignment when the optical wiring layer 11 is stacked on the electric substrate 12. That is, the optical wiring layer 11 and the electric substrate 12 are so stacked that the conductive projections made of a conductive metal or the like extend through the through holes 41 formed in the optical wiring layer 11. The optical wiring layer 11 and the electric substrate 12 are desirably completely adhered by forming an adhesive layer 47 by coating.

Figure 22B:
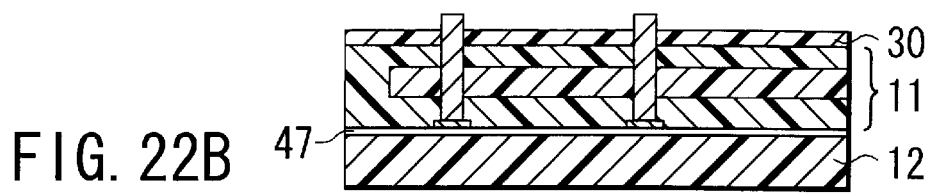

Next, as shown in FIG. 22B, a thin metal film 30 is formed by sputtering on the surface of the stacked optical wiring layer 11.

Figure 22C:
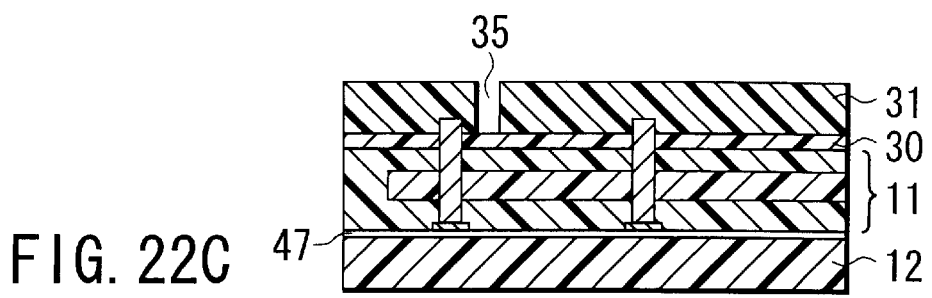

As shown in FIG. 22C, a photoresist 31 is formed by coating. Exposure and development are then performed to form a photoresist opening 35 for mirror formation.

Figure 22D:
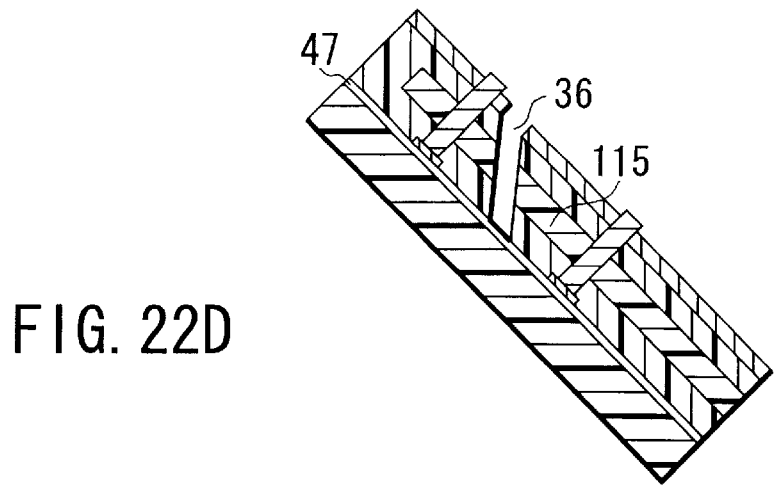

As shown in FIG. 22D, an opening 36 is formed in the thin metal film 30 by etching, and a metal mask for mirror formation is formed. In addition, the substrate is inclined 45°, and a mirror 115 is formed by RIE dry etching.

Figure 22E:
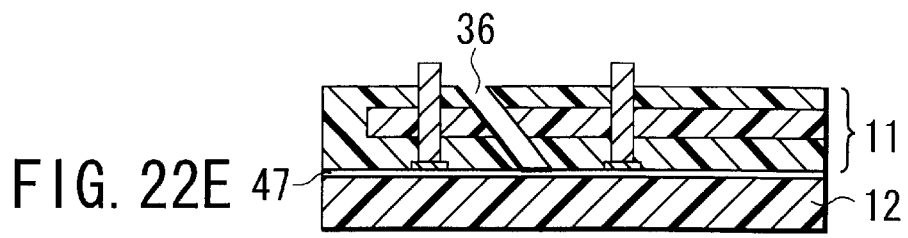

Finally, as shown in FIG. 22E, the metal mask is dissolved away to complete the optical-electric printed wiring board 62 of the present invention.

Another fabrication method of the optical-electric printed wiring board is a buildup method (the first embodiment). This method is not the method explained in the third embodiment in which the optical wiring layer 11 and the electric wiring substrate 12 are stacked after being separately fabricated. That is, this method is an optical-electric printed wiring board fabrication method by which an optical substrate material is stacked while being patterned directly on the electric wiring substrate 12. As already described previously, when the optical-electric printed wiring board 62 is to be fabricated by this buildup method, the conductive projections can be formed on the electric substrate before the optical wiring substrate is built up, or can be formed by forming via holes and filling these holes with plating after the optical substrate is stacked.

(4) Printed Circuit Board Fabrication Method

The method of fabricating a printed circuit board obtained by mounting an optical part on the optical-electric printed wiring board 62 according to the third embodiment will be described below (with reference to FIG. 19).

First, the recess 24 in each terminal 223 is slightly soldered, and the end portion of each conductive projection is lightly inserted into the recess of the terminal 223. Assume that the shape of the recess in the terminal 223 is a circle 80 μm in radius, and the depth of the recess is 50 μm. Note also that the number of conductive projections is four, and the shape of each projection is a circle 75 μm in radius. When terminals for an electric part (a CPU or memory) are additionally formed, this electric part is placed on slightly soldered metal pads.

According to the experiment conducted by the present inventors, when the device was left to stand in a reflow furnace at a temperature of 250° for 10 seconds and then cooled, the terminals of an optical part were fixed in equilibrium positions determined by the shape of the recess and the surface tension of the molten solder, and the optical axis of the laser fell within the range of the central position of the mirror ±3 μm. When flat metal terminals having no recess similar to an electric part and conducting struts were adhered via solder, the fixed positions of the optical part were unstable, and errors of about ±50 μm were produced. The recesses ensured highly accurate alignment between the electrical conduction and the mirror for optical wiring. In addition, the apexes of the struts were directly electrically connected as pads to metal terminals of an optical part. Accordingly, the reliability of the electrical connection can be improved.

The following effects can be obtained by the above-mentioned arrangement.

First, the optical wiring layer 11 is formed on the substrate 12 having electric interconnects, so high-density mounting or miniaturization is possible.

Second, the relative positional relationship between the pattern of the core 111 including the mirror 115 in the optical wiring layer 11 and the individual conductive projections for mounting an optical part can be matched with the intended one with extremely high accuracy.

Third, the end portion of each conductive projection is accurately accommodated in the recess of a terminal of an optical part. This facilitates optically aligning the optical axis of the optical part with that of the optical interconnect. Therefore, an optical part and an electric part can be automatically mounted at the same time.

Fourth, when an optical part or an electric part is to be soldered, the part is directly connected to conductive struts formed by plating. Therefore, the reliability of the connection improves without any influence of solder melting heat. At the same time, the reliability of the connection with the electric interconnects on the substrate also improves.

(Fourth Embodiment)

An optical-electric printed wiring board 64 according to the fourth embodiment will be described below. An important point of the optical-electric printed wiring board according to this fourth embodiment is that fine projecting guides for guiding the connecting positions of terminals 221 of an optical part are formed around end faces 14a, 15a, 16a, and 17a.

Figure 23:
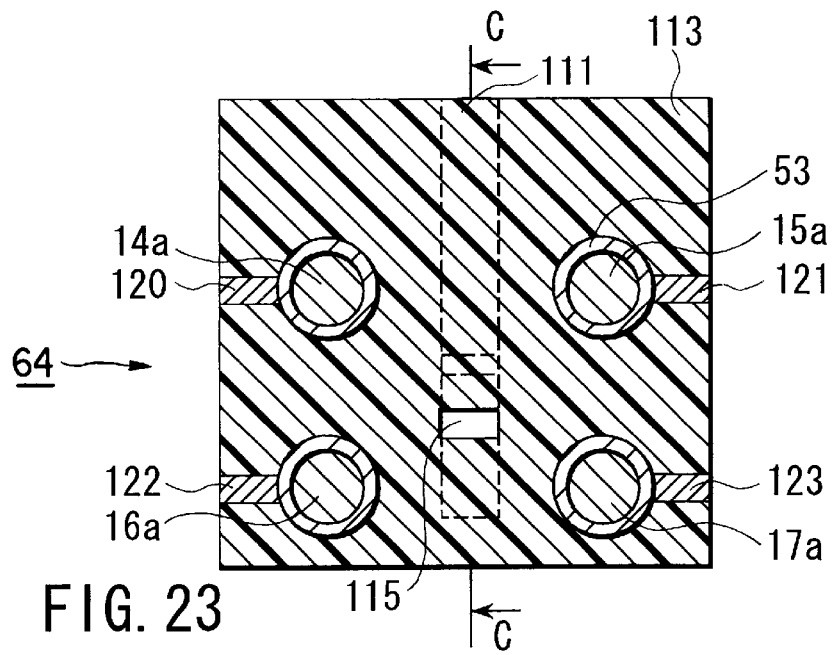
FIG. 23 is a top view showing, from the optical part mounting side, an optical-electric printed wiring board 64 according to the fourth embodiment.
Figure 24:
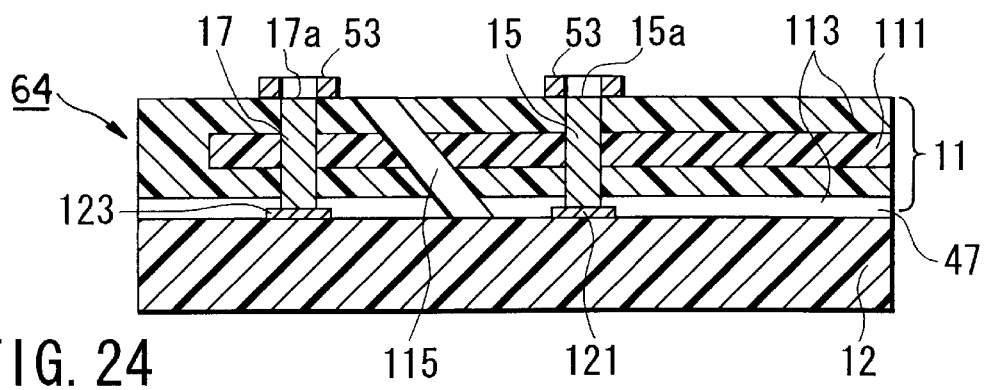
FIG. 24 is a sectional view taken along a direction C—C in FIG. 23.
Figure 25:
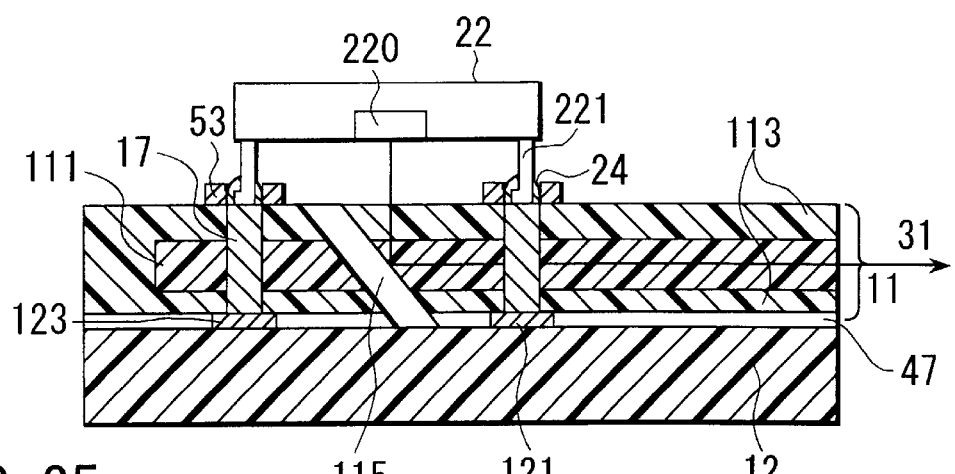
FIG. 25 is a sectional view showing an optical-electric printed wiring board 64 mounting a laser light emitting element 22.

FIG. 23 is a top view showing, from the optical part mounting side, the optical-electric printed wiring board 62 according to the fourth embodiment. FIG. 24 is a sectional view taken along a direction C—C in FIG. 23. FIG. 25 is a view showing the optical-electric printed wiring board 62 mounting a laser light emitting element 22.

Referring to FIGS. 23 and 24, a partition wall 53 formed around each of the end faces 14a, 15a, 16a, and 17a is depicted as an example of a projecting guide 53.

As shown in FIG. 25, the terminal 221 of an optical part is smoothly accommodated in a recess partitioned by the partition wall 53, and desirably, soldered to the end face of a conductive projection in this recess. When the shape of the recess formed by the partition wall 53 and the shape of the terminal of an optical part are similar, the range within which the terminal 221 is movable is restricted. Since the movable range of the optical part is regulated, therefore, the optical axis of the light emitting laser 22 can be accurately aligned with that of a mirror 115 having a width of a few μm. In addition, the light emitting laser 22 can be strongly fixed and, if necessary, can be electrically connected to electric interconnects.

This projecting partition wall 53 is desirably capable of tightly accommodating the terminal 221 of an optical part. However, the partition wall 53 need not be continuous like a bank but can be disconnected in pieces. The partition wall 53 has conductivity to enhance the electrical connection between an optical part and each of conductive projections 14, 15, 16, and 17. If, however, the partition wall 53 is used only to fix the position of an optical part, the partition wall 53 need not conduct to the conductive projection. In this case, the positions of these partition walls 53 need not correspond to the conductive projections 14, 15, 16, and 17.

Furthermore, an electric part other than an optical part is also electrically connected to electric interconnects on a substrate 12 via the conductive projections. When this electric part is to be mounted, no precise alignment is necessary, so the projecting partition walls 53 need not be formed. However, it is also possible to form these partition walls 53, if necessary, in order to ensure the area of electrical connection. The projecting partition walls 53 and the conductive projections are formed by photolithography and plating. Therefore, the positions of these walls and projections can be determined, as needed, by alignment marks (not shown) formed on the substrate 12.

<Fabrication Method of Optical-Electric Printed Wiring Board>

The fabrication method of the optical-electric printed wiring board 64 according to the fourth embodiment will be described in detail below with reference to the accompanying drawings, in the order of (1) an optical wiring layer fabrication method, (2) an electric wiring substrate fabrication method, and (3) an optical-electric printed wiring board fabrication method.

(1) Optical Wiring Layer Fabrication Method

FIGS. 26A to 26E are sectional views showing the individual steps of the method of fabricating the optical-electric printed wiring board 64. FIGS. 26A to 26E are arranged in the order of execution.

Figure 26A:
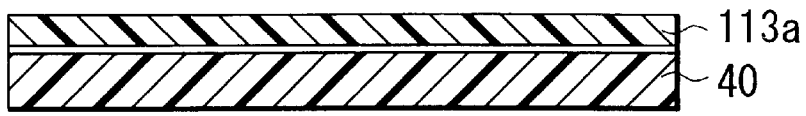
FIGS. 26A to 26E are sectional views showing the individual steps of a method of fabricating an optical wiring layer 11.

As shown in FIG. 26A, a silicon wafer 40 is coated with a cladding layer 113a (a support medium of an optical wiring layer for guiding light, e.g., fluorinated polyamic acid as a precursor of a fluorinated polyimide-based resin or a fluorinated epoxy-based resin is used) about 20 to 100 μm thick. If this cladding layer 113a is a polyamic acid solution, the layer is calcined for 1 to 2 hr at 350° C. for imidization. If the cladding layer 113a is an epoxy-based resin, the layer is UV-cured or polymerized at 100 to 200° C.

Figure 26B:
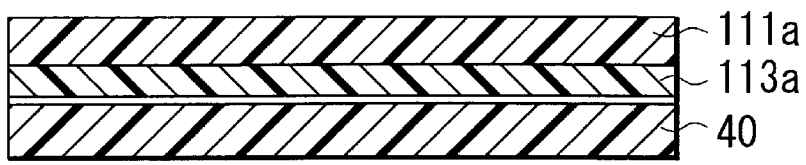

Next, as shown in FIG. 26B, an 8-μm thick core layer 111a serving as an optical waveguide is evenly formed by an appropriate coating method by selecting a resin, e.g., a fluorine-based polyamic acid solution or a polymethylmethacrylate resin solution, having a refractive index suited to a wavelength to be guided.

Figure 26C:
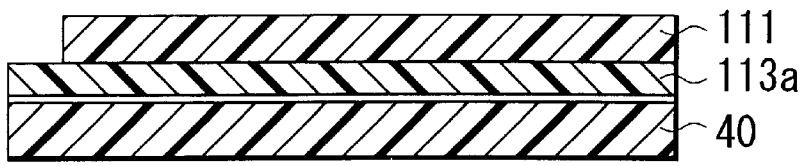

As shown in FIG. 26C, if the core layer 111a is photosensitive, an optical waveguide (i.e., a core 111) is formed by patterning by the conventional photolithography method, and cured in accordance with the material. If the core layer 111a is not photosensitive, after this core layer 111a is cured, a metal mask having a predetermined pattern is formed, and a waveguide pattern is formed by RIE dry etching. In addition, a layer about 20 to 100 μm thick is formed by coating by using the same material as the cladding layer previously formed.

Figure 26D:
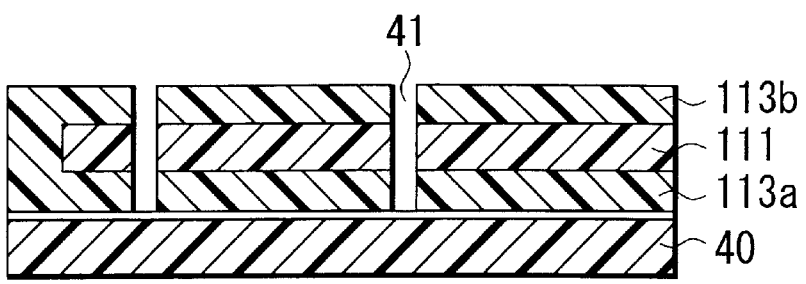

Subsequently, as shown in FIG. 26D, through holes 41 are formed in predetermined positions. That is, these holes are formed by irradiation with an excimer laser via a mask having a predetermined pattern.

Figure 26E:
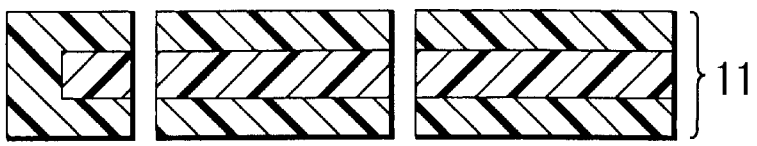

Finally, as shown in FIG. 26E, a film-like optical wiring layer 11 including the through holes 41 can be formed by peeling this optical wiring layer 11 from the silicon wafer 40.

In this method, perfect through holes can be formed with no tailings left behind.

(2) Electric Wiring Substrate Fabrication Method

The method of fabricating the electric wiring substrate 12 will be described with reference to FIGS. 27A to 27E.

Figure 27A:
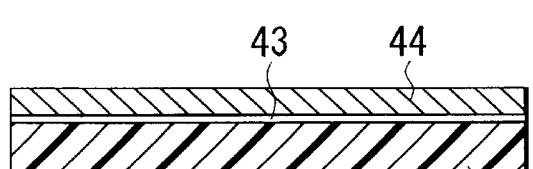
FIGS. 27A to 27J are sectional views for explaining a method of fabricating an electric wiring substrate 12, and a method of stacking the optical wiring layer 11 on the electric wiring substrate 12 by using conductive projections.

First, as shown in FIG. 27A, on an appropriate insulating substrate 12 such as a glass epoxy substrate, a thin copper film about 20 μm thick is formed by, e.g., plating, sputtering, or evaporation. Also, a desired metal interconnect 43 (i.e., electric interconnects 120, 121, 122, and 123) is formed by the conventional photolithography method. In addition, to form a plurality of conductive projections, a thin metal film 44 is formed by sputtering.

Figure 27F:
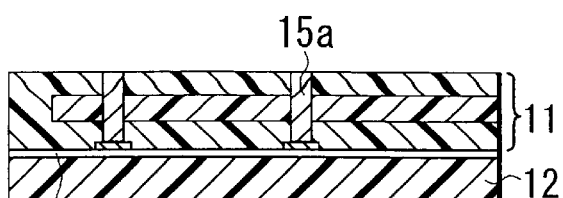
Figure 27B:
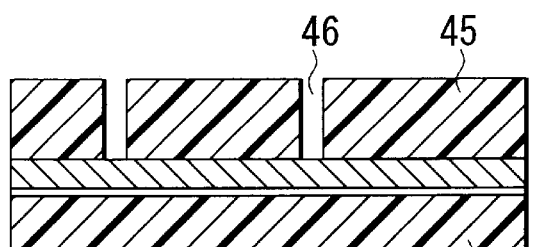

Next, as shown in FIG. 27B, the thin metal film 44 is coated with a resist 45, and this resist 45 is developed to form openings 44.

The thin metal film 44 is used as a cathode to perform copper plating, thereby filling the openings 46 with copper as much as possible.

Figure 27G:
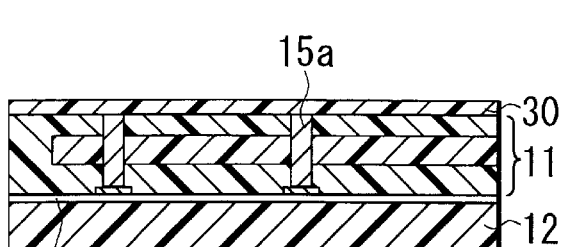
Figure 27C:
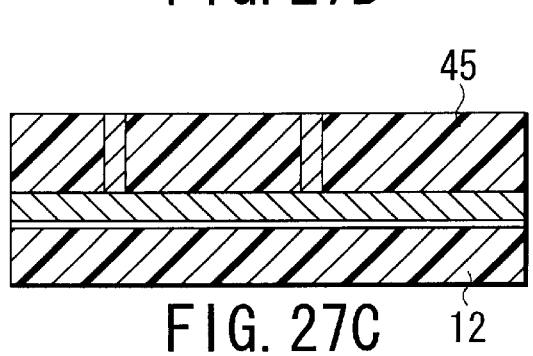

As shown in FIG. 27C, the resist 45 is removed.

Figure 27H:
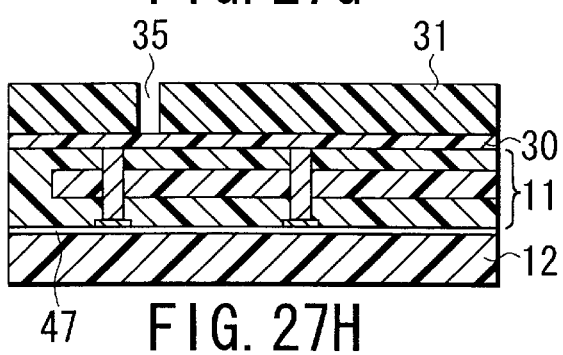
Figure 27D:
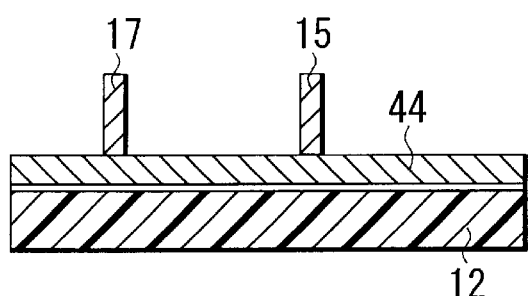
Figure 27I:
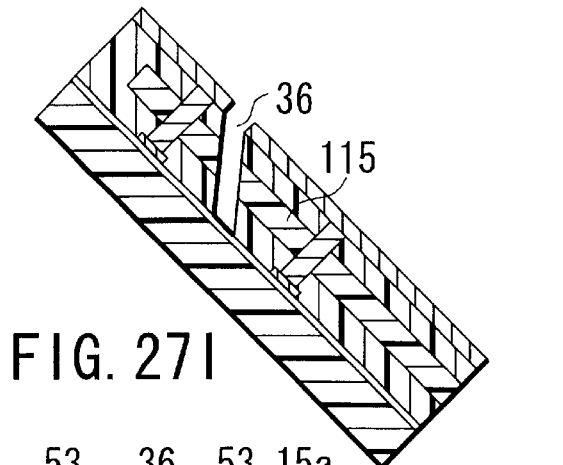
Figure 27E:
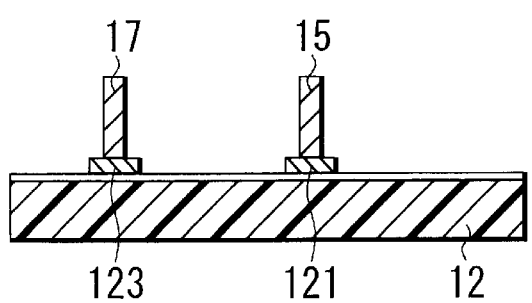

Finally, as shown in FIG. 27E, the thin metal film 44 is etched away to form conductive projections 14, 15, 16, and 17 on the electric interconnect 43.

As already described previously, the conductive projections are desirably formed using a mask having a shape, such as a column or a square pillar, matching the shape of a terminal of an optical part. The height of this conductive projection can be controlled by the film thickness of the resist or the plating time. According to the experiment conducted by the present inventors, the diameter and height of the conductive projection are preferably about 50 to 100 µm and about 20 to 200 µm, respectively.

(3) Optical-Electric Printed Wiring Board Fabrication Method

The method of stacking the optical wiring layer 11 on the electric wiring substrate 12 by using the conductive projections will be explained below with reference to FIGS. 27F to 27J.

First, as shown in FIG. 27F, a plurality of conductive projections 14, 15, 16, and 17 are used as guides for stacking the optical wiring layer 11 on the electric substrate 12 by aligning them. That is, the optical wiring layer 11 and the electric substrate 12 are so stacked that the conductive projections 14, 15, 16, and 17 extend through the through holes 41 in the film to reach the opposite surface of the optical wiring layer 11. It is desirable that the optical wiring layer 11 and the electric substrate 12 be completely adhered by forming an adhesive layer 47 by coating between the optical wiring layer 11 and the electric substrate 12.

Next, as shown in FIG. 27G, a thin metal film 30 is formed by sputtering on the surface of the stacked optical wiring layer 11.

As shown in FIG. 27H, a photoresist 31 is formed by coating. Exposure and development are then performed following the conventional procedures to form a photoresist opening 35 for mirror formation.

Subsequently, as shown in FIG. 27I, an opening 36 is formed in the thin metal film 30 by etching, and a metal mask for mirror formation is formed. In addition, the substrate is inclined 45°, and a mirror 115 is formed by RIE dry etching.

Figure 27J:
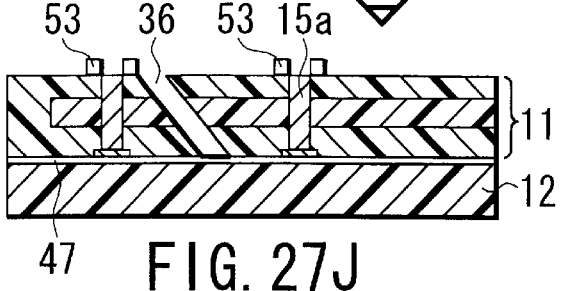

Finally, projecting partition walls 53 shown in FIG. 27J are formed in desired positions by the following procedure. First, a 60-µm thick photosensitive dry film is closely adhered, and the conventional exposure and development are performed to form a photoresist opening for frame formation. The thin metal film 30 is used as a cathode to perform copper plating, and the resist is removed. The frame height can be controlled by the dry film thickness and the plating time. Finally, the thin metal mask is dissolved away to complete the optical-electric printed wiring board having the projecting partition walls 53.

The projecting partition walls 53 can also be formed by a thick inorganic film using a green sheet or from a heat-resistant photoresist, in addition to a plated metal. Either partition wall can be easily formed by the conventional photolithography. The frame shape is desirably matched with the shape of a terminal of an optical part.

Another method of fabricating conductive projections is to perform laser beam irradiation or dry etching, from the optical wiring layer side, for appropriate positions on the optical-electric printed wiring board. In this fabrication method, the electric interconnect formed on the substrate 12 functions as a stopper, so the via hole (opening 36) can be formed to this depth. A conductive projection can be formed by filling this via hole with a metal by plating.

(4) Printed Circuit Board Fabrication Method

The method of fabricating a printed circuit board obtained by mounting an optical part including a light emitting laser on the optical-electric printed wiring board 64 according to the third embodiment will be described below.

First, solder balls are placed inside the partition walls 53, and the terminals 221 of an electric part (a laser or photodiode) are lightly inserted inside these partition walls 53. Assume that the shape of the partition wall 53 is a circle 20 µm in width and 80 µm in radius, and the depth of the partition wall 53 is 50 µm. Note also that the number of conducting terminals 221 of an optical part is four, and the shape of each terminal is a circle 75 µm in radius. Terminals for an electric part (a CPU or memory) formed where necessary are placed on slightly soldered metal pads.

According to the experiment conducted by the present inventors, when the device was left to stand in a reflow furnace at a temperature of 250° for 10 seconds and then cooled, the terminals of an optical part were fixed in equilibrium positions determined by the shape of the frame and the surface tension of the molten solder, and the optical axis of the laser fell within the range of the central position of the mirror ±3 µm. When the terminals of an optical part were placed on flat metal pads having no recess similar to an electric part, the fixed positions of the optical part were unstable, and errors of about ±50 µm were produced. Accordingly, the partition walls 53 ensure highly accurate alignment between the electrical conduction and the mirror for optical wiring. Also, the partition walls 53 widen the area of the electrical conduction between the conductive projections and the optical part. This can further improve the reliability of the electrical connection.

The following effects can be obtained by the above-mentioned arrangement.

First, the optical wiring layer 11 is formed on the substrate 12 having electric interconnects, so high-density mounting or miniaturization is possible.

Second, the relative positional relationship between the pattern of the core 111 including the mirror 115 in the optical wiring layer 11 and the individual conductive projections for mounting an optical part can be matched with the intended one with extremely high accuracy.

Third, each terminal of an optical part is accurately accommodated in a recess formed by the partition wall 53. This facilitates optically aligning the optical axis of the optical part with that of the optical interconnect. Therefore, an optical part and an electric part can be automatically mounted at the same time.

Fourth, when an optical part or an electric part is to be soldered, the part is directly connected to conductive struts formed by plating. Therefore, the reliability of the connection improves without any influence of solder melting heat. At the same time, the reliability of the connection with the electric interconnects on the substrate also improves.

The present invention has been described above by way of its embodiments. However, those skilled in the art can reach various changes and modifications within the scope of the idea of the present invention. Therefore, it is to be understood that those changes and modifications also belong to the range of the present invention. For example, the present invention can be variously changed without departing from the gist of the invention, as indicated below.

In each embodiment, a mirror formed in an optical interconnect is so formed that the incident angle of light propagating in the optical interconnect is 45°. However, this is for the sake of simplicity of explanation, so the angle is not limited to this one. Accordingly, when a mirror by which the incident angle is a different angle is formed, any arbitrary light propagation path can be formed by performing designing in accordance with the angle (e.g., the positions of individual conductive projections are properly matched with the angle).

What is claimed is:

1. An optical-electric printed wiring board comprising an electric wiring substrate having an electric interconnect, and an optical wiring layer stacked on said electric wiring substrate and having a surface on which an optical part is mounted, wherein said optical wiring layer comprises:
a core in which light propagates;
a core cladding which sandwiches said core; and
a mirror which reflects light propagating in said core toward said optical part, or reflects light from said optical part into said core, and said electric wiring substrate comprises a first conductive setting member which is a conductor extending through said optical wiring layer in the direction of stacking, and having a flat end face on which said optical part to be mounted is set, said first conductive setting member obtaining electrical conduction between said optical part to be mounted and said electric interconnect.

2. An optical-electric printed wiring board according to claim 1, wherein the number of said first conductive setting member corresponds to the number of electrical connecting terminals of said optical part to be mounted.

3. An optical electric printed wiring board according to claim 2, wherein the positions of said first conductive setting member correspond to the positions of said electrical connecting terminals of said optical part to be mounted.

4. An optical-electric printed wiring board according to claim 2, further comprising a guide member formed around the end face of each first conductive setting member on which said optical part to be mounted is set, said guide member limiting the set position of said optical part by limiting the set position of said terminal.

5. An optical-electric printed wiring board according to claim 4, wherein said guide member is a conductor and electrically connected to said optical part to be mounted or said conductive setting member.

6. An optical-electric printed wiring board according to claim 2, wherein:
the end face of each first conductive setting member is exposed by a hole formed in said optical wiring layer, and
the set position of said optical part is limited by accommodating said terminal in said hole.

7. An optical-electric printed wiring board according to claim 4 or 6, wherein the depth of said guide member or said hole is 20 or 200 $\mu$m.

8. An optical-electric printed wiring board according to claim 2, wherein the end face of each first conductive setting member projects to a predetermined position from the surface of said optical wiring layer on which an optical interconnect is to be mounted.

9. An optical-electric printed wiring board according to claim 1, wherein the diameter of the end face of said first conductive setting member is 50 to 500 $\mu$m.

10. An optical-electric printed wiring board according to claim 1, wherein said electric wiring substrate further comprises:
a second conductive setting member which is a conductor extending through said optical wiring layer in the direction of stacking and having a flat end face on which an electric part to be mounted is set, said second conductive setting member obtaining electrical conduction between said electric part to be mounted and said electric interconnect.

11. An optical-electric printed wiring board according to claim 10, further comprising an electric interconnect on the surface on which an optical part is to be mounted, said electric interconnect being connected to an optical part or an electric part.

12. A printed-circuit board comprising:
an optical-electric printed wiring board according to claim 1; and
an optical part mounted on said optical-electric printed wiring board,
wherein said optical part has a terminal having a shape corresponding to the shape of the end face of said first conductive setting member, and connected to said first conductive setting member.

13. A printed-circuit board comprising:
an optical-electric printed wiring board according to claim 1; and
an electric part mounted on said optical-electric printed wiring board.

14. A printed circuit board according to claim 13, wherein said electric part has a terminal having a shape corresponding to the shape of the and face of said first conductive setting member, and connected to said first conductive setting member.

15. An optical-electric printed wiring board, comprising:
an optical wiring layer;
an optical part on said optical wiring layer; and
an electric wiring substrate on which said optical wiring layer is stacked, said electric wiring substrate comprising a conductor extending through said optical wiring layer in the direction of stacking and having a flat end face on which said optical part is set, said conductor column providing electrical conduction between said optical part and said electric wiring substrate.

16. A method of fabricating an optical-electric printed wiring board, comprising:
forming a first conductive setting member which is a conductor column on a predetermined electric interconnect of an electric wiring substrate;
coating the electric wiring substrate with a first cladding wire;
coating the first cladding layer with a core layer;
coating a portion of the first cladding layer and the core layer with a second cladding layer to obtain an optical wiring layer;
exposing an end face of the first conductive setting member from the optical wiring layer;
forming an electric interconnect on the optical wiring layer; and
forming a mirror in a predetermined position of the optical wiring layer by peroration.

17. A method of fabricating an optical-electric printed wiring board, comprising:
forming a first conductive setting member which is a conductor column on a predetermined electric interconnect of an electric wiring substrate;
forming an optical wiring layer on a support substrate;
forming a through hole which allows the first conductive setting member to extend therethrough in the optical wiring layer; and
peeling the optical wiring layer from the supported substrate, and stacking the optical wiring layer on the electric wiring substrate such that the first conductive setting member extends through the hole.

18. A method of fabricating an optical-electric printed wiring board according to claim 17, wherein the first conductive setting member is formed by plating.

* * * * *

UNITED STATES PATENT AND TRADEMARK OFFICE
CERTIFICATE OF CORRECTION

PATENT NO. : 6,739,761 B2
DATED : May 25, 2004
INVENTOR(S) : Takehito Tsukamoto et al.

It is certified that error appears in the above-identified patent and that said Letters Patent is hereby corrected as shown below:

Column 24,
Line 18, change "and" to -- end --;
Line 59, change "supported" to -- support --.

Signed and Sealed this

Twenty-sixth Day of October, 2004

JON W. DUDAS
*Director of the United States Patent and Trademark Office*